United States Patent
Oikawa et al.

(10) Patent No.: US 8,609,464 B2
(45) Date of Patent: Dec. 17, 2013

(54) METHOD FOR SHIELDING SEMICONDUCTOR DEVICE

(75) Inventors: Yoshiaki Oikawa, Tochigi (JP); Hironobu Shoji, Tochigi (JP); Shingo Eguchi, Tochigi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 90 days.

(21) Appl. No.: 12/476,491

(22) Filed: Jun. 2, 2009

(65) Prior Publication Data

US 2009/0302456 A1    Dec. 10, 2009

(30) Foreign Application Priority Data

Jun. 6, 2008   (JP) .................................. 2008-149693

(51) Int. Cl.
*H01L 21/00* (2006.01)

(52) U.S. Cl.
USPC ........... 438/110; 438/458; 438/463; 257/701; 257/E23.089

(58) Field of Classification Search
USPC .................. 438/110, 463; 257/E23.089, 701; 340/572.1, 572.8
See application file for complete search history.

(56) References Cited

U.S. PATENT DOCUMENTS

| | | | |
|---|---|---|---|
| 6,224,965 B1 | 5/2001 | Haas et al. | |
| 6,399,903 B1 * | 6/2002 | Stevenson | ..................... 200/5 A |
| 6,403,221 B1 | 6/2002 | Nakamura et al. | |
| 7,049,178 B2 | 5/2006 | Kim et al. | |
| 7,132,984 B2 * | 11/2006 | Kameda et al. | ........ 343/700 MS |
| 7,193,862 B2 * | 3/2007 | Maekawa et al. | ............. 361/795 |
| 7,485,489 B2 | 2/2009 | Björbell | |
| 7,504,317 B2 | 3/2009 | Aoki et al. | |
| 7,510,950 B2 | 3/2009 | Tsurume et al. | |
| 7,776,656 B2 | 8/2010 | Watanabe et al. | |
| 7,791,153 B2 | 9/2010 | Tsurume et al. | |
| 7,888,163 B2 | 2/2011 | Chida et al. | |

(Continued)

FOREIGN PATENT DOCUMENTS

| | | |
|---|---|---|
| CN | 101136063 | 3/2008 |
| EP | 1092739 | 4/2001 |

(Continued)

OTHER PUBLICATIONS

Invitation to Pay Additional Fees (Application No. PCT/JP2009/059923) dated Jun. 30, 2009.

(Continued)

*Primary Examiner* — Thao Le
*Assistant Examiner* — Matthew Gordon
(74) *Attorney, Agent, or Firm* — Eric J. Robinson; Robinson Intellectual Property Law Office, P.C.

(57) ABSTRACT

To provide a simple method for manufacturing a semiconductor device in which deterioration in characteristics due to electrostatic discharge is reduced, a plurality of element layers each having a semiconductor integrated circuit and an antenna are sealed between a first insulator and a second insulator; a layered structure having a first conductive layer formed on a surface of the first insulator, the first insulator, the element layers, the second insulator, and a second conductive layer formed on a surface of the second insulator is formed; and the first insulator and the second insulator are melted, whereby the layered structure is divided so as to include at least one of the semiconductor integrated circuits and one of the antennas.

24 Claims, 21 Drawing Sheets

(56) References Cited

U.S. PATENT DOCUMENTS

| | | | |
|---|---|---|---|
| 7,928,510 | B2 | 4/2011 | Watanabe |
| 8,103,897 | B2 | 1/2012 | Endo et al. |
| 8,357,567 | B2 | 1/2013 | Watanabe |
| 8,384,209 | B2 | 2/2013 | Oikawa et al. |
| 2005/0148121 | A1 | 7/2005 | Yamazaki et al. |
| 2005/0233122 | A1 | 10/2005 | Nishimura et al. |
| 2007/0077691 | A1 | 4/2007 | Watanabe |
| 2007/0181875 | A1 | 8/2007 | Yamazaki et al. |
| 2007/0229271 | A1 | 10/2007 | Shionoiri et al. |
| 2008/0042168 | A1 | 2/2008 | Watanabe et al. |
| 2008/0044940 | A1 | 2/2008 | Watanabe et al. |
| 2008/0054976 | A1 | 3/2008 | Endo et al. |
| 2008/0224941 | A1 | 9/2008 | Sugiyama et al. |
| 2008/0242005 | A1 | 10/2008 | Dozen et al. |
| 2008/0303140 | A1 | 12/2008 | Ohtani et al. |
| 2009/0057875 | A1 | 3/2009 | Aoki et al. |
| 2009/0085182 | A1 | 4/2009 | Yamazaki et al. |
| 2009/0212297 | A1 | 8/2009 | Watanabe et al. |
| 2009/0289340 | A1* | 11/2009 | Yamazaki et al. ............ 257/679 |
| 2009/0289341 | A1 | 11/2009 | Yamazaki et al. |
| 2009/0302457 | A1 | 12/2009 | Chida et al. |
| 2009/0305467 | A1* | 12/2009 | Goto et al. .................... 438/125 |
| 2009/0314527 | A1 | 12/2009 | Hatano et al. |
| 2013/0149816 | A1 | 6/2013 | Oikawa et al. |

FOREIGN PATENT DOCUMENTS

| | | |
|---|---|---|
| EP | 1589797 | 10/2005 |
| EP | 1 818 860 | 8/2007 |
| JP | 10-092980 | 4/1998 |
| JP | 2006-066899 A | 3/2006 |
| JP | 2007-059888 A | 3/2007 |
| JP | 2007-123859 A | 5/2007 |
| JP | 2007-241999 | 9/2007 |
| JP | 2007-245542 A | 9/2007 |
| JP | 2007-251191 A | 9/2007 |
| JP | 2007-280368 A | 10/2007 |
| JP | 2008-084303 | 4/2008 |
| WO | WO 01/01740 | 1/2001 |
| WO | WO 2004/001848 | 12/2003 |
| WO | WO-2006/011665 | 2/2006 |
| WO | WO-2007/043285 | 4/2007 |
| WO | WO-2007/105606 | 9/2007 |

OTHER PUBLICATIONS

Chinese Office Action (Application No. 200980120672.3) Dated Apr. 19, 2012.

* cited by examiner

114

112
110

116

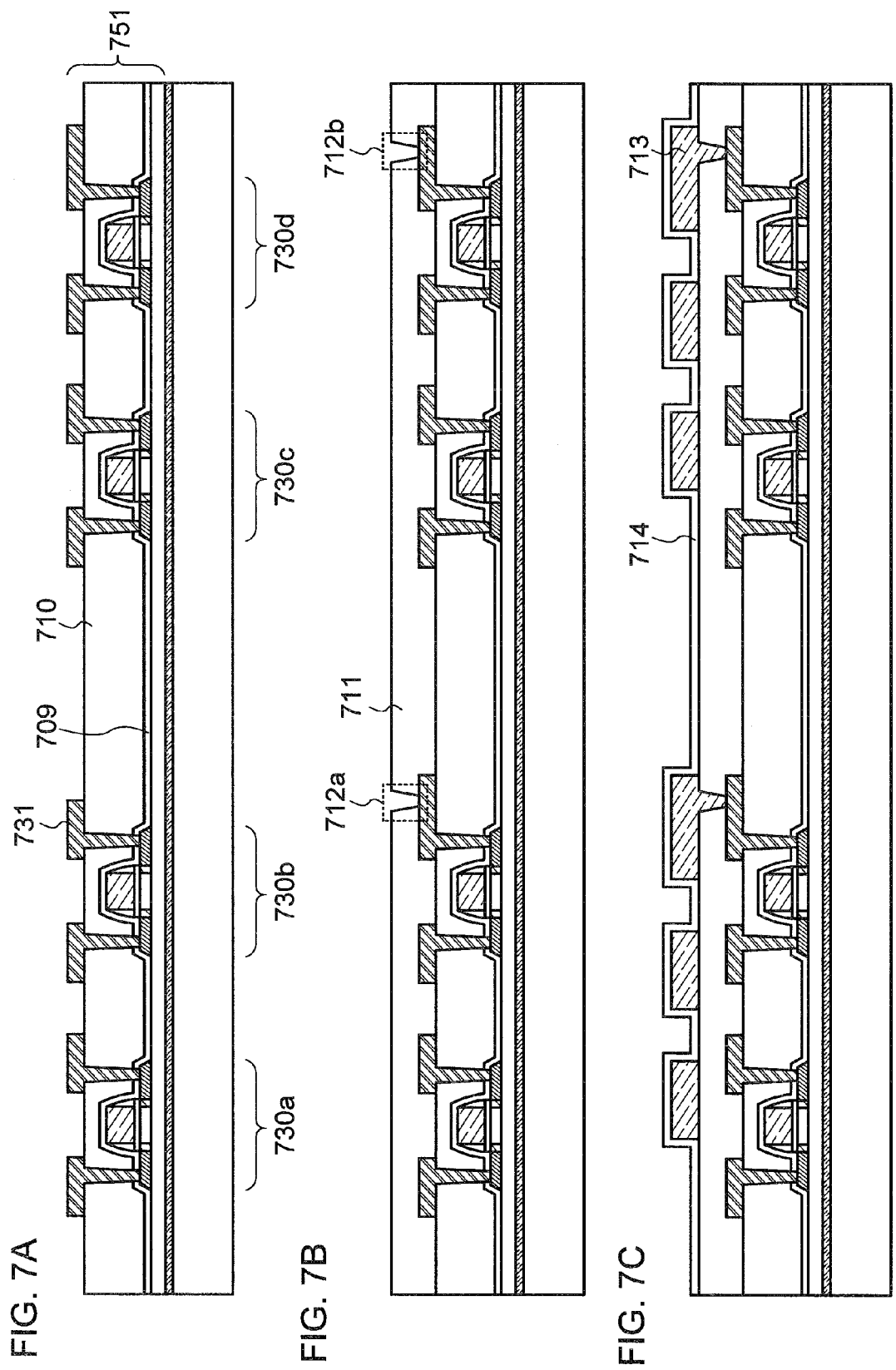

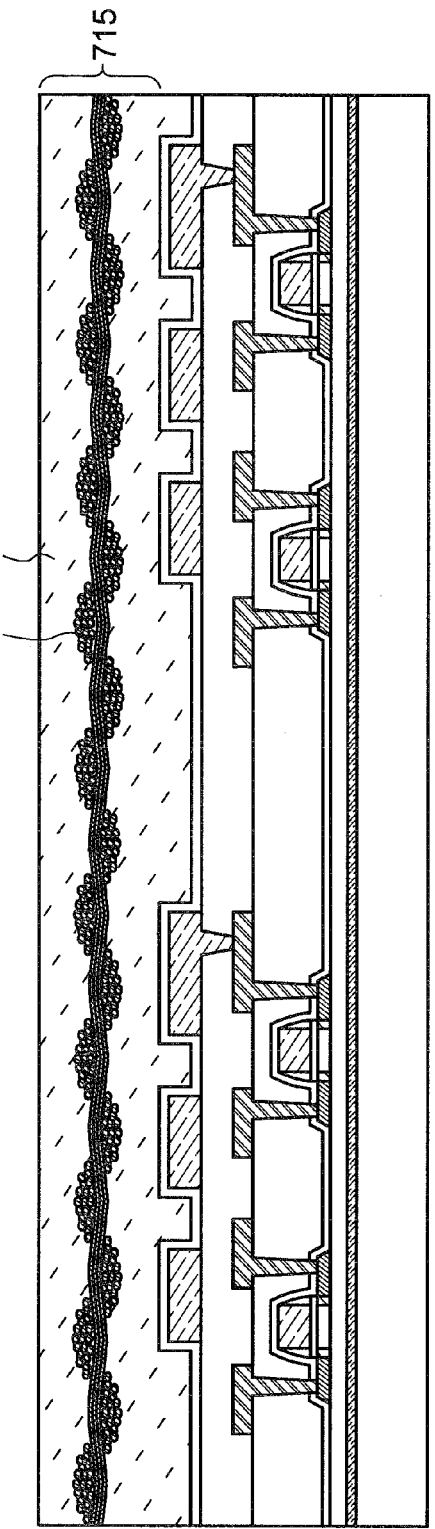
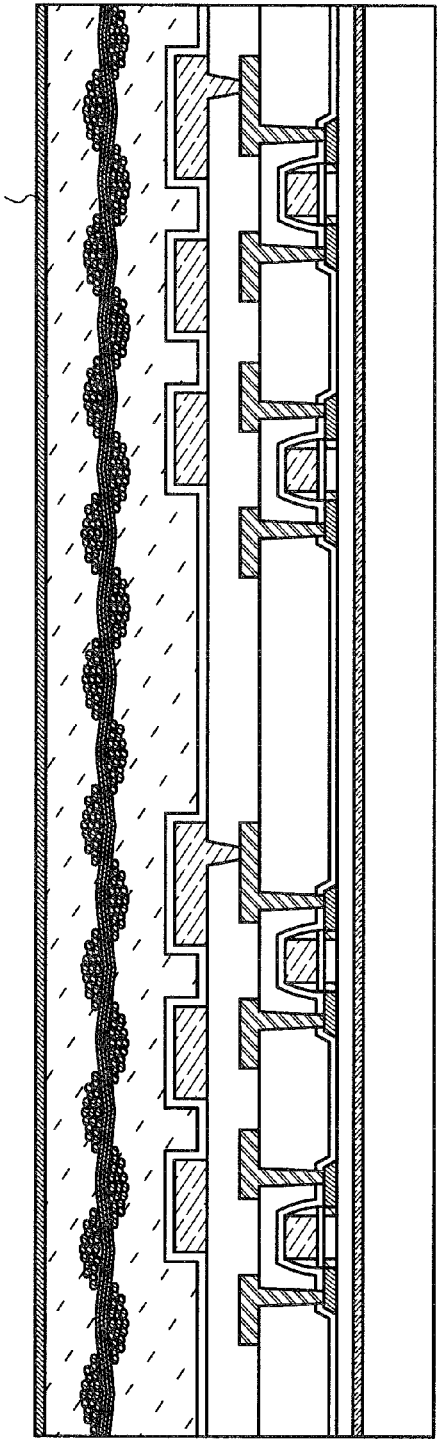
FIG. 8A
FIG. 8B

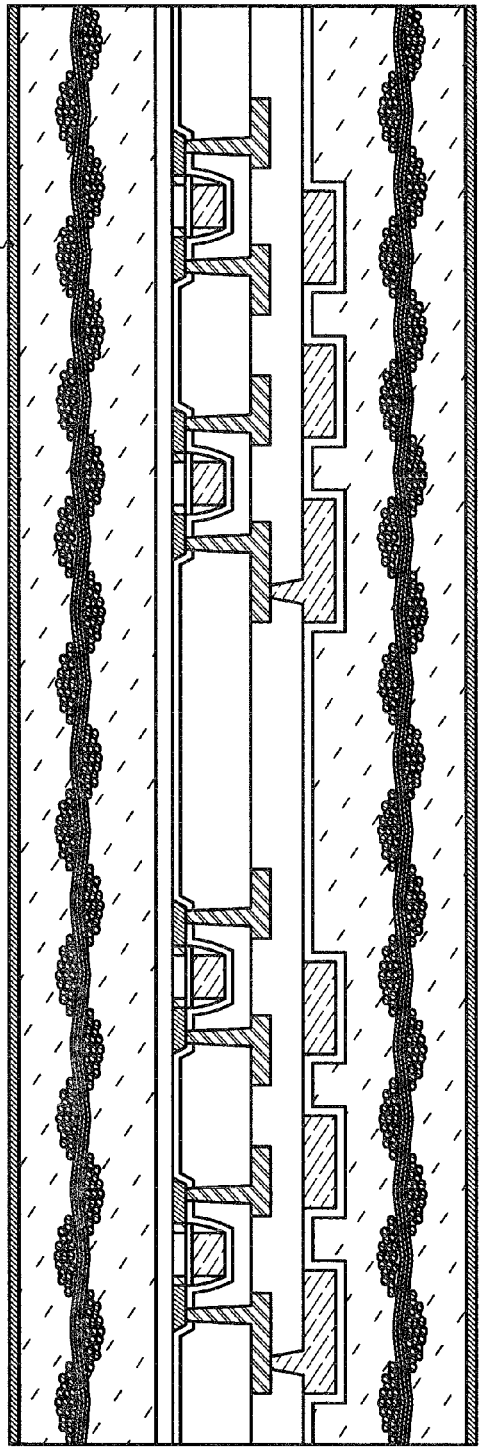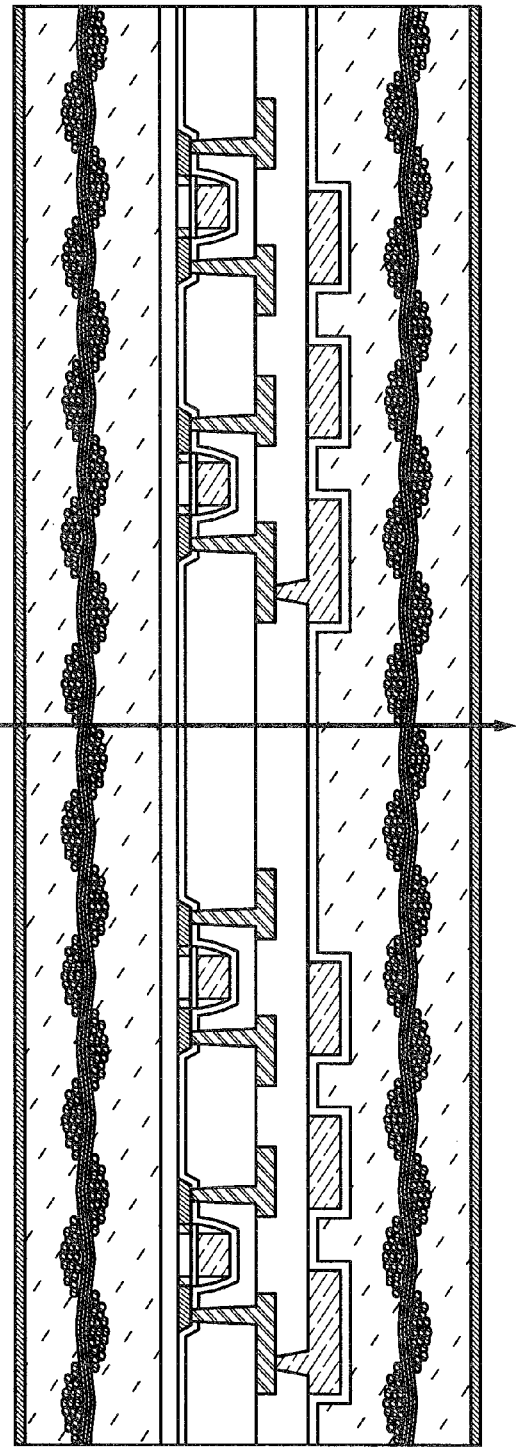

190

191

197

193

194

195

196

METHOD FOR SHIELDING SEMICONDUCTOR DEVICE

TECHNICAL FIELD

The technical field relates to a method for manufacturing a semiconductor device.

BACKGROUND ART

In semiconductor devices wirelessly transmitting and receiving data via an antenna (also referred to as a wireless signal processing device, a semiconductor integrated circuit chip, an IC chip, and the like), damage to the semiconductor devices due to electrostatic discharge (electrostatic breakdown) is a serious problem at every stage such as a manufacturing stage, a test stage and a usage stage as a product, which causes lower reliability and productivity, and measures against the problem have been considered (for example, see Patent Document 1).

In Patent Document 1, electrostatic breakdown is prevented by using a conductive polymer as a substrate or an adhesive of a semiconductor device.

[Patent Document 1] Japanese Published Patent Application No. 2007-241999

DISCLOSURE OF INVENTION

As the market for the aforementioned semiconductor devices grows, the semiconductor devices need to have a wider variety of shapes and higher performance. Therefore, semiconductor devices having higher resistance to electrostatic breakdown and various required properties have been required.

In addition, semiconductor devices having sufficient properties need to be manufactured by a simpler method.

Thus, one object of an embodiment of the invention disclosed in this specification or the like (at least including the specification, claims, and drawings) is to provide a simple method for manufacturing a semiconductor device in which deterioration in characteristics due to electrostatic discharge is reduced.

In one embodiment of the disclosed invention, a conductive layer is formed on an insulating surface of a semiconductor device in order to increase the resistance to electrostatic breakdown. When a plurality of semiconductor devices are divided into separate devices, a means to melt an insulator (e.g., laser light irradiation) is used.

In a method for manufacturing a semiconductor device, which is one embodiment of the disclosed invention, a plurality of element layers each having a semiconductor integrated circuit and an antenna are sealed between a first insulator and a second insulator; a layered structure having a first conductive layer formed on a surface of the first insulator, the first insulator, the element layers, the second insulator, and a second conductive layer formed on a surface of the second insulator is formed; and the first insulator and the second insulator are melted, whereby the layered structure is divided so as to include at least one of the semiconductor integrated circuits and one of the antennas.

In another method for manufacturing a semiconductor device, which is one embodiment of the disclosed invention, a plurality of element layers each having a semiconductor integrated circuit and an antenna are sealed between a first insulator and a second insulator; a layered structure having a first conductive layer formed on a surface of the first insulator, the first insulator, the element layers, the second insulator, and a second conductive layer formed on a surface of the second insulator is formed; and the layered structure is irradiated with laser light, whereby the layered structure is divided so as to include at least one of the semiconductor integrated circuits and one of the antennas.

It is preferable that the first conductive layer and the second conductive layer be electrically connected by the aforementioned dividing step. It is also preferable that the resistance between the first conductive layer and the second conductive layer be reduced to 1 G$\Omega$ or less by the aforementioned dividing step.

In the aforementioned structures, the first conductive layer or the second conductive layer can have a multi-layer structure. For example, two or more conductive layers may be stacked or a conductive layer and an insulating layer may be stacked. In addition, at least one of the first insulator and the second insulator preferably has a thickness of 5 μm to 50 μm.

In the aforementioned structures, it is preferable that the first insulator or the second insulator have a structure body in which a fibrous body is impregnated with an organic resin.

In the aforementioned structures, a booster antenna that is electromagnetically coupled to an antenna may be provided.

In the aforementioned structures, an insulating layer or the like may be provided on a surface of the semiconductor integrated circuit and the antenna. As a result, the reliability of the semiconductor device can be further improved.

A semiconductor device that is one embodiment of the disclosed invention includes a first conductive layer, a first insulator over the first conductive layer, a second insulator over the first insulator, a second conductive layer over the second insulator, and an element layer sealed between the first insulator and the second insulator. Each of the first insulator and the second insulator has a cut surface formed by melting, and the first conductive layer and the second conductive layer are electrically connected to each other through the cut surfaces.

Another semiconductor device that is one embodiment of the disclosed invention includes a first conductive layer, a first insulator over the first conductive layer, a second insulator over the first insulator, a second conductive layer over the second insulator, and an element layer sealed between the first insulator and the second insulator. Each of the first insulator and the second insulator has a cut surface formed by laser light irradiation, and the first conductive layer and the second conductive layer are electrically connected to each other through the cut surfaces.

Note the in this specification and the like, the semiconductor device refers to a device capable of functioning by utilizing semiconductor properties. By one embodiment of the disclosed invention, a device having a circuit provided with semiconductor elements (transistors, memory elements, diodes, and the like) can be manufactured.

By forming the conductive layer on the surface of the semiconductor device, electrostatic breakdown of the semiconductor integrated circuit (malfunction of the circuit, damage to the semiconductor elements, and the like) can be prevented. Furthermore, by dividing semiconductor devices into separate devices by laser light irradiation, a semiconductor device having sufficient resistance to electrostatic breakdown can be obtained by an extremely simple method.

BRIEF DESCRIPTION OF DRAWINGS

In the accompanying drawings:

FIGS. 7A to 7C are diagrams illustrating a method for manufacturing a semiconductor device;

FIGS. 8A and 8B are diagrams illustrating a method for manufacturing a semiconductor device;

FIGS. 10A and 10B are diagrams illustrating a method for manufacturing a semiconductor device;

BEST MODE FOR CARRYING OUT THE INVENTION

Figure 1A:
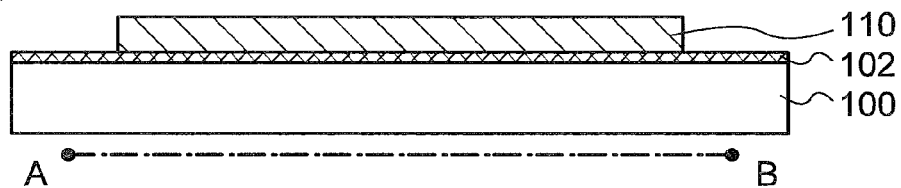
FIGS. 1A to 1D are diagrams illustrating a method for manufacturing a semiconductor device.

Embodiments will be described below in detail with reference to drawings. Note that the present invention is not limited to the description of the embodiments, and it is apparent to those skilled in the art that modes and details can be modified in various ways without departing from the spirit of the present invention disclosed in this specification and the like. In addition, structures of different embodiments can be implemented in an appropriate combination. Note that in the structures of the present invention described below, like portions or portions having a similar function are denoted by like reference numerals, and the description thereof is omitted.

[Embodiment 1]

A method for manufacturing a semiconductor device, which is one embodiment of the disclosed invention, will be described with reference to FIGS. 1A to 1D, FIGS. 2A to 2C, FIGS. 3A to 3C, FIGS. 4A to 4C, and FIGS. 5A and 5B.

Figure 3A:
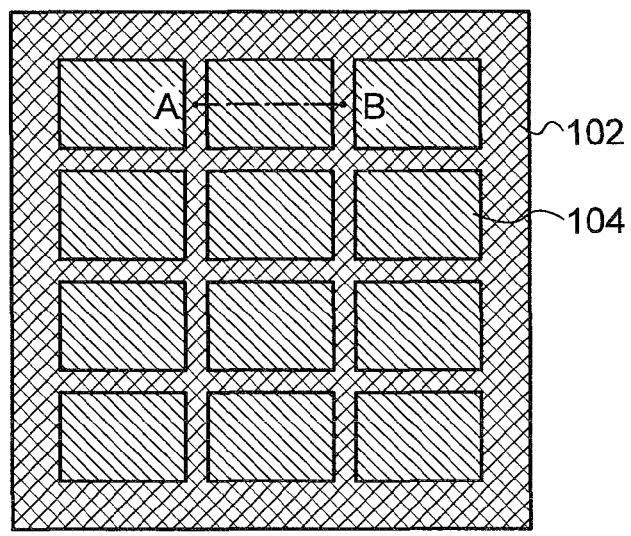
FIGS. 3A to 3C are diagrams illustrating a method for manufacturing a semiconductor device.
Figure 3B:
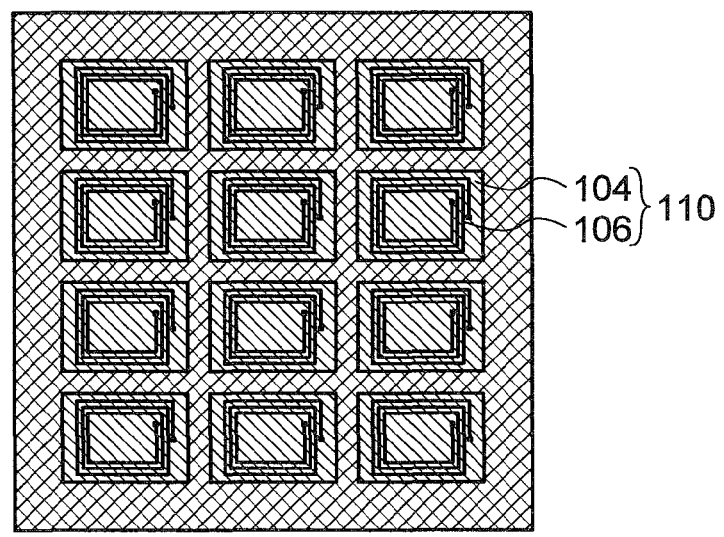

First, an element layer 110 having a semiconductor integrated circuit 104 and an antenna 106 is formed over a substrate 100 having an insulating surface with a separation layer 102 interposed therebetween (see FIGS. 1A, 3A, and 3B). Note that FIG. 1A is a cross-sectional view taken along line A-B of FIG. 3A.

As the substrate 100 having an insulating surface, a glass substrate, a quartz substrate, a sapphire substrate, a ceramic substrate, a metal substrate on which an insulating layer is formed, or the like can be used. Alternatively, a plastic substrate having heat resistance to the processing temperature of this embodiment may be used. The substrate 100 having an insulating surface can be selected as appropriate in accordance with the manufacturing steps of the semiconductor device.

The separation layer 102 is formed by sputtering, plasma CVD, coating, printing, or the like using an element selected from tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), iridium (Ir), silicon (Si), and the like, an alloy containing such an element as its main component, a compound containing such an element as its main component, or the like. The separation layer 102 may have a single-layer structure or a multi-layer structure. A layer containing silicon may have any of an amorphous structure, a microcrystalline structure, and a polycrystalline structure. Note that the coating method includes spin coating, droplet discharging, dispensing, and the like.

In the case where the separation layer 102 has a single-layer structure, it is preferable to use a tungsten layer, a molybdenum layer, or a layer containing a mixture of tungsten and molybdenum. Alternatively, a layer containing oxide or oxynitride of tungsten, a layer containing oxide or oxynitride of molybdenum, a layer containing oxide or oxynitride of a mixture of tungsten and molybdenum, or the like may be used. Note that the mixture of tungsten and molybdenum corresponds to, for example, an alloy of tungsten and molybdenum.

In the case where the separation layer 102 has a multi-layer structure, it is preferable that a tungsten layer, a molybdenum layer, or a layer containing a mixture of tungsten and molybdenum be formed as a first layer, and a layer containing oxide, nitride, oxynitride, or nitride oxide of tungsten; a layer containing oxide, nitride, oxynitride, or nitride oxide of molybdenum; or a layer containing oxide, nitride, oxynitride, or nitride oxide of a mixture of tungsten and molybdenum be formed as a second layer.

In the case where the separation layer 102 has a multi-layer structure of a layer containing tungsten and a layer containing oxide of tungsten, it may be formed in the following manner: the layer containing tungsten is formed and an insulating layer made of oxide is formed thereover, whereby the layer containing oxide of tungsten is formed at the interface between the tungsten layer and the insulating layer. Alternatively, the layer containing oxide of tungsten may be formed by performing thermal oxidation treatment, oxygen plasma treatment, treatment with a highly oxidizing solution such as ozone water, or the like on the surface of the layer containing tungsten. The aforementioned plasma treatment and heat treatment may be performed in an atmosphere of oxygen, nitrogen, dinitrogen monoxide, or a mixed gas of such a gas and another gas. The layer containing nitride, oxynitride, and nitride oxide of tungsten may also be formed in a similar manner.

In the above step, the separation layer 102 is formed in contact with the substrate 100 having an insulating surface; however, the embodiment of the disclosed invention is not limited to this structure. An insulating layer serving as a base may be formed in contact with the substrate 100 having an insulating surface, and then the separation layer 102 may be formed in contact with the insulating layer.

Figure 1B:
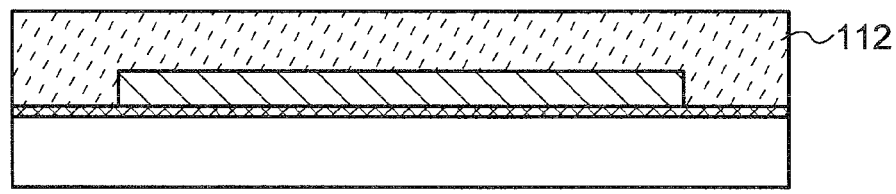
Figure 3C:
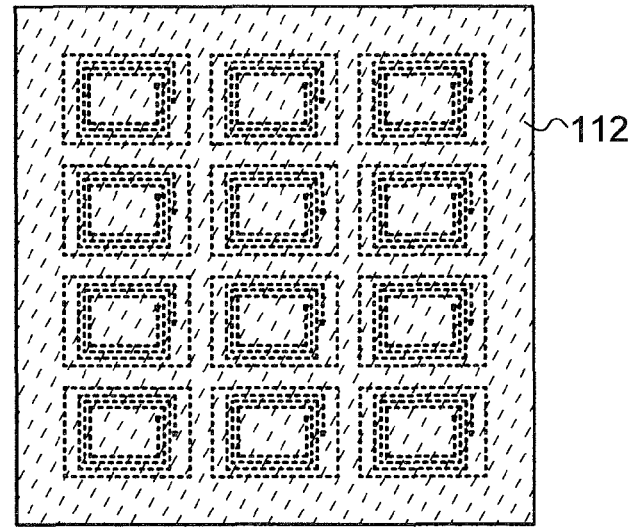

Next, a first insulator 112 is bonded to the element layer 110 (see FIGS. 1B and 3C). As the first insulator 112, a flexible substrate is preferably used, though the embodiment of the disclosed invention is not limited thereto. The first insulator 112 may have a single-layer structure or a multi-layer structure. Note that the first insulator 112 may be bonded to the element layer 110 with an adhesive, or a material functioning as an adhesive may be used for the first insulator 112.

Alternatively, a structure body in which a fibrous body is impregnated with an organic resin may be used as the first insulator 112. In that case, the organic resin of the structure body is cured or plasticized by thermocompression bonding of the structure body. Note that, if the organic resin has thermoplasticity, the organic resin that has been plasticized by thermocompression bonding is cured when cooled to room temperature. The organic resin that has been subjected to thermocompression bonding spreads uniformly to be in close contact with a semiconductor integrated circuit and is cured. The above step of pressure-bonding the structure body may be performed under an atmospheric pressure or a reduced pressure.

The first insulator 112 is preferably made of a high-strength material. As typical examples of the high-strength material, there are a polyvinyl alcohol-based resin, a polyester-based resin, a polyamide-based resin, a polyethylene-based resin, an aramid-based resin, a polyparaphenylene benzobisoxazole resin, a glass resin, and the like. If a high-strength material having elasticity is used for the first insulator 112, a local load can be spread entirely, which results in prevention of damage to the semiconductor device. More specifically, it is preferable to use, as the first insulator 112, an aramid resin, a polyethylene naphthalate (PEN) resin, a polyethersulfone (PES) resin, a polyphenylene sulfide (PPS) resin, a polyimide (PI) resin, or the like.

Figure 1C:
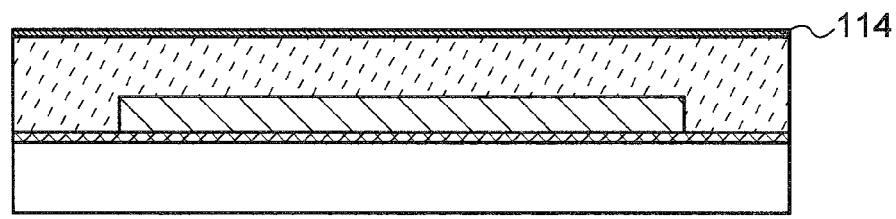
Figure 4A:
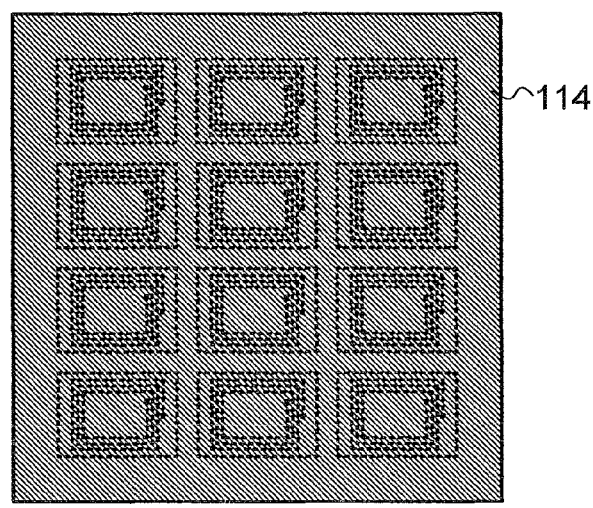
FIGS. 4A to 4C are diagrams illustrating a method for manufacturing a semiconductor device.
Figure 4B:
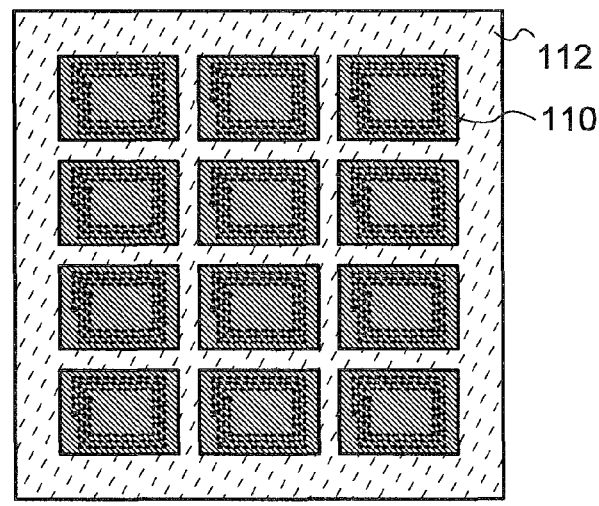

Next, a first conductive layer 114 is formed on a surface of the first insulator 112 (see FIGS. 1C and 4A). The first conductive layer 114 can be made of a material such as metal, metal oxide, or metal nitride.

More specifically, the first conductive layer 114 can be made of, for example, an element selected from titanium, molybdenum, tungsten, aluminum, copper, silver, gold, nickel, platinum, tin, palladium, iridium, rhodium, tantalum, cadmium, zinc, iron, silicon, germanium, zirconium, and barium, an alloy containing such an element as its main component, or a compound containing such an element as its main component.

As the nitride material, tantalum nitride, titanium nitride, or the like can be used. As the oxide material, indium tin oxide (ITO), indium tin oxide containing silicon oxide (ITSO), organoindium, organotin, zinc oxide, or the like can be used. It is also possible to use indium zinc oxide (IZO) containing zinc oxide (ZnO), zinc oxide containing gallium (Ga), tin oxide ($SnO_2$), indium oxide containing tungsten oxide, indium zinc oxide containing tungsten oxide, indium oxide containing titanium oxide, indium tin oxide containing titanium oxide, or the like.

Alternatively, a semiconductor material having conductivity may be used. For example, a silicon material doped with an impurity element such as phosphorus can be used.

Further alternatively, a conductive macromolecule (also referred to as a conductive polymer) may be used for the first conductive layer 114. As the conductive macromolecule, a so-called π-electron conjugated conductive macromolecule can be used. As the π-electron conjugated conductive macromolecule, for example, there are polyaniline or a derivative thereof, polypyrrole or a derivative thereof, and polythiophene or a derivative thereof. Alternatively, a copolymer of plural kinds of those materials may be used.

The first conductive layer 114 can be formed by a dry process such as sputtering, plasma CVD, or evaporation, or a wet process such as coating, printing, or droplet discharging (ink-jet). The first conductive layer 114 can also be formed by plating such as electrolytic plating or electroless plating.

Note that the first conductive layer 114 may have a single-layer structure or a multi-layer structure. Only part of the first conductive layer 114 needs to include a conductive layer, and the first conductive layer 114 may have a multi-layer structure of a conductive layer and an insulating layer.

Figure 1D:
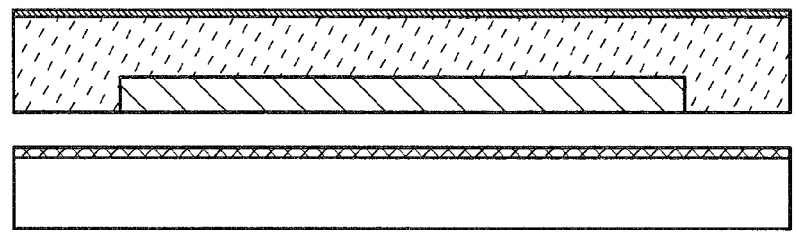

Next, the element layer 110 is separated from the substrate 100 along the separation layer 102 (see FIGS. 1D and 4A).

Note that the element layer 110 can be separated from the substrate by any of the following methods: a method in which a metal oxide film is formed between the separation layer and the element layer and weakened by crystallization so that the element layer can be separated; a method in which a metal oxide film is formed between the separation layer and the element layer and weakened by crystallization, and the separation layer is partially removed by etching; a method in which an amorphous silicon film is formed between the substrate and the element layer and removed by laser light irradiation or etching so that the element layer can be separated; and a method in which the substrate over which the element layer is formed is etched or mechanically removed (polished). It is also possible to use a method in which a film containing nitrogen, oxygen, hydrogen, or the like (e.g., an amorphous silicon film containing hydrogen, an alloy film containing hydrogen, or an alloy film containing oxygen) is formed as the separation layer, and the separation layer is irradiated with laser light so that nitrogen, oxygen, hydrogen, or the like contained in the separation layer is released as gas to promote separation.

The above separation methods may be used in combination, which makes it easier to perform the separation step. That is, separation (using a removing device or the like) can also be performed after laser light irradiation, etching with gas or a solution, mechanical removing, and the like are performed in appropriate combination so that separation between the separation layer and the element layer easily starts.

Alternatively, the interface between the separation layer and the element layer may be soaked with a liquid, whereby the element layer is separated from the substrate.

Figure 2A:
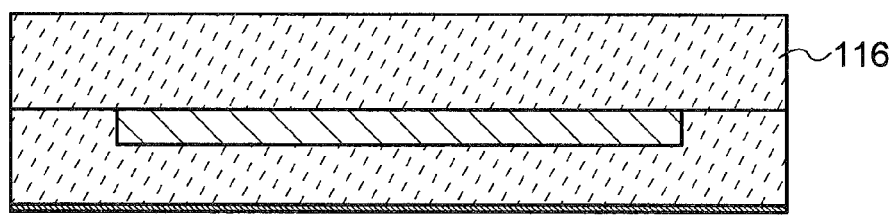
FIGS. 2A to 2C are diagrams illustrating a method for manufacturing a semiconductor device.
Figure 4C:
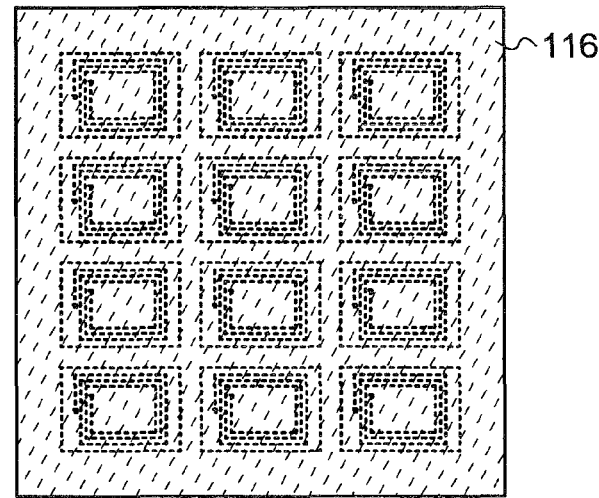

Next, a second insulator 116 is bonded to a surface (see FIG. 4B) on which the element layer 110 is exposed (see FIGS. 2A and 4C). The second insulator 116 can be formed using a material similar to that of the first insulator 112 and bonded in a manner similar to the first insulator 112. Through the above steps, the element layer 110 having the semiconductor integrated circuit 104 and the antenna 106 is sealed between the first insulator 112 and the second insulator 116. Note that, like the first insulator 112, the second insulator 116 may have a single-layer structure or a multi-layer structure.

Figure 2B:
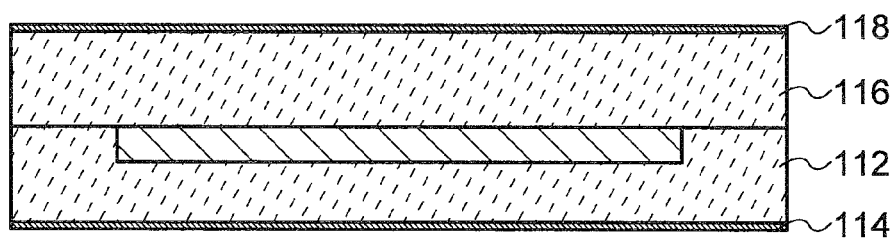
Figure 5A:
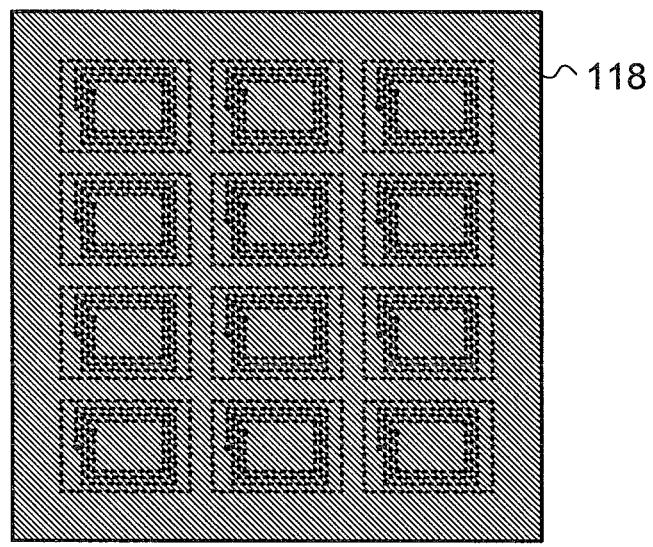
FIGS. 5A and 5B are diagrams illustrating a method for manufacturing a semiconductor device.

Then, a second conductive layer 118 is formed on a surface of the second insulator 116 (see FIGS. 2B and 5A). The material and manufacturing method of the second conductive layer 118 are similar to those of the first conductive layer 114. Note that only part of the second conductive layer 118 needs to include a conductive layer, and the second conductive layer 118 may have a multi-layer structure of a conductive layer and an insulating layer. Through the above steps, a plurality of the element layers 110 each having the semiconductor integrated circuit 104 and the antenna 106 are sealed between the first insulator 112 and the second insulator 116. Thus, the first conductive layer 114 is formed on the surface of the first insulator 112, and the second conductive layer 118 is formed on the surface of the second insulator 116.

Figure 2C:
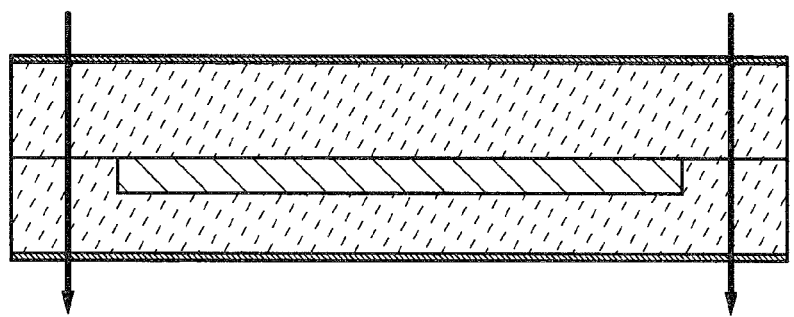
Figure 5B:
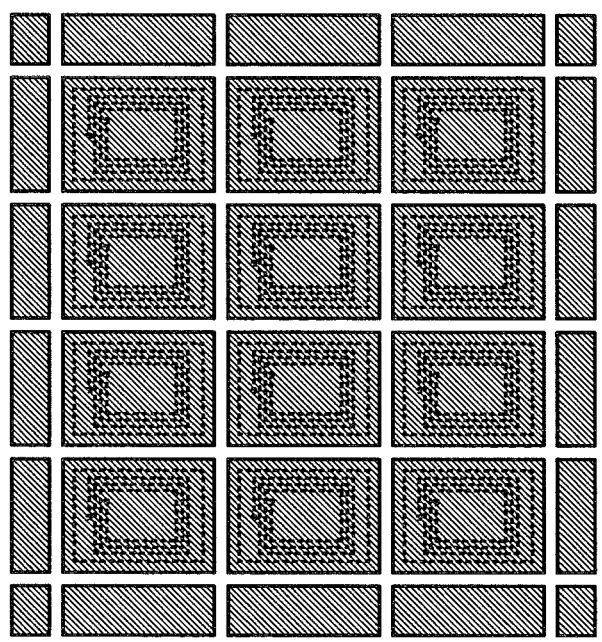

Next, the aforementioned structure is divided into separate semiconductor devices (see FIGS. 2C and 5B). As a dividing means, it is preferable to use a means to melt the first insulator 112 and the second insulator 116 in dividing (it is more preferable to use a means to melt the first conductive layer 114 and the second conductive layer 118). In this embodiment, laser light irradiation is used for dividing the semiconductor devices.

There is no particular limitation on the conditions, such as wavelength, intensity, and beam size of the laser light used for the dividing of the semiconductor devices. The laser light irradiation may be performed under such conditions that the semiconductor devices can be divided. As a laser beam, it is possible to use, for example, a continuous-wave laser beam emitted from a laser such as an Ar laser, a Kr laser, a $CO_2$ laser, a YAG laser, a $YVO_4$ laser, a YLF laser, a $YAlO_3$ laser, a $GdVO_4$ laser, a $Y_2O_3$ laser, a ruby laser, an alexandrite laser, a Ti:sapphire laser, or a helium-cadmium laser; or a pulsed laser beam emitted from a laser such as an Ar laser, a Kr laser, an excimer (ArF, KrF, or XeCl) laser, a $CO_2$ laser, a YAG laser, a $YVO_4$ laser, a YLF laser, a $YAlO_3$ laser, a $GdVO_4$ laser, a $Y_2O_3$ laser, a ruby laser, an alexandrite laser, a Ti:sapphire laser, a copper vapor laser, or a gold vapor laser.

As described in this embodiment, by dividing the semiconductor devices into separate devices by laser light irradiation, the resistance between the first conductive layer 114 and the second conductive layer 118 is decreased, whereby the first conductive layer 114 and the second conductive layer 118 are electrically connected to each other. Accordingly, the step of dividing the semiconductor devices and the step of electrically connecting the first conductive layer 114 and the second conductive layer 118 can be performed at a time. Note that a cut surface is formed on the side of each of the first insulator 112 and the second insulator 116 by the aforementioned dividing step. Therefore, the first conductive layer 114 and the second conductive layer 118 can be considered to be electrically connected to each other through the cut surfaces.

The resistance between the first conductive layer 114 and the second conductive layer 118 may be, for example, 1 G$\Omega$ or less, preferably about 5 M$\Omega$ to 500 M$\Omega$, and more preferably about 10 M$\Omega$ to 200 M$\Omega$. Therefore, dividing of the semiconductor devices may be performed by laser light irradiation or the like so that such a resistance can be obtained.

Through the above steps, the semiconductor device of this embodiment is manufactured.

Since the semiconductor device shown in this embodiment includes the first conductive layer 114 and the second conductive layer 118, externally applied static electricity can be dissipated and eliminated, or localization of charges can be prevented. Thus, electrostatic breakdown of the semiconductor integrated circuit 104 can be prevented.

In addition, since the semiconductor devices are divided by laser light irradiation in this embodiment, the first conductive layer 114 can be electrically connected to the second conductive layer 118, which allows charges to be dissipated efficiently. Accordingly, electrostatic breakdown can be prevented more effectively as compared to the case where the first conductive layer 114 and the second conductive layer 118 are not electrically connected.

Furthermore, by using laser light in this embodiment, the step of dividing the semiconductor devices and the step of electrically connecting the first conductive layer 114 and the second conductive layer 118 can be performed at a time. Therefore, this embodiment is advantageous in that the process can be simplified as compared to the case where the step of dividing the semiconductor devices and the step of electrically connecting the conductive layers are performed separately.

Note that the semiconductor device shown in this embodiment operates (has a wireless function) when induced electromotive force is generated by externally applied electromagnetic waves. Accordingly, the first conductive layer 114 and the second conductive layer 118 need to have a function of preventing electrostatic breakdown and a structure for transmitting electromagnetic waves.

It is generally known that electromagnetic waves are attenuated in a substance, particularly in a conductive material. Accordingly, in this embodiment, each of the first conductive layer 114 and the second conductive layer 118 is made to have such a thickness that electromagnetic waves pass therethrough. Specifically, the thickness of each of the first conductive layer 114 and the second conductive layer 118 may be determined in accordance with the frequency of electromagnetic waves used for communication, the resistivity and magnetic permeability of the conductive material, and the like.

For example, in the case where electromagnetic waves have a frequency of 13.56 MHz and titanium (resistivity $\rho$: $5.5 \times 10^{-7}$ ($\Omega \cdot m$)) is used as the conductive material, the thickness of each of the first conductive layer 114 and the second conductive layer 118 is set to at least 500 nm or less, preferably 100 nm or less, and more preferably 30 nm or less. As a result, damage to the semiconductor device due to electrostatic discharge can be suppressed and good communication with the outside can be achieved.

It is needless to say that the conductive material is not limited to titanium. For example, in the case of using indium tin oxide containing silicon oxide (also referred to as ITSO) having a lower resistivity than titanium, the thickness of each of the first conductive layer 114 and the second conductive layer 118 may be set to 1 $\mu$m or less, preferably 700 nm or less, and more preferably 500 nm or less.

The minimum thickness of each of the first conductive layer 114 and the second conductive layer 118 is preferably determined based on the resistivity. For example, in the case where a conductive material having a high resistivity is used for the first conductive layer 114 and the second conductive layer 118, the first conductive layer 114 and the second conductive layer 118 are preferably made thick enough to effectively dissipate static electricity. This is because, if the first conductive layer 114 and the second conductive layer 118 are made thin, sheet resistance increases and static electricity cannot be effectively dissipated, and thus the semiconductor integrated circuit 104 is more likely to be damaged.

In consideration of the above, the thickness of each of the first conductive layer 114 and the second conductive layer 118 is preferably determined so as to have a sheet resistance of $1.0 \times 10^7$ $\Omega$/square or less, preferably $1.0 \times 10^4$ $\Omega$/square or less, and more preferably $1.0 \times 10^2$ $\Omega$/square or less. In addition, in view of the transmission of electromagnetic waves, it is preferable that the thickness of each of the first conductive layer 114 and the second conductive layer 118 be as small as possible while the above sheet resistance is satisfied. For example, in the case of using titanium, the first conductive layer 114 and the second conductive layer 118 may each have a thickness of 1 nm or more, and preferably have a thickness of about 10 nm to 30 nm. In the case of using indium tin oxide containing silicon oxide (also referred to as ITSO), the first conductive layer 114 and the second conductive layer 118 may each have a thickness of 10 nm or more, and preferably have a thickness of about 50 nm to 200 nm.

By such a method shown in this embodiment, damage to the semiconductor device due to electrostatic discharge can be suppressed effectively, and the semiconductor device capable of good communication with the outside can be obtained.

[Embodiment 2]

In this embodiment, a more specific example of a method for manufacturing a semiconductor device will be described with reference to FIGS. 6A to 6C, FIGS. 7A to 7C, FIGS. 8A and 8B, FIGS. 9A and 9B, and FIGS. 10A and 10B.

Figure 6A:
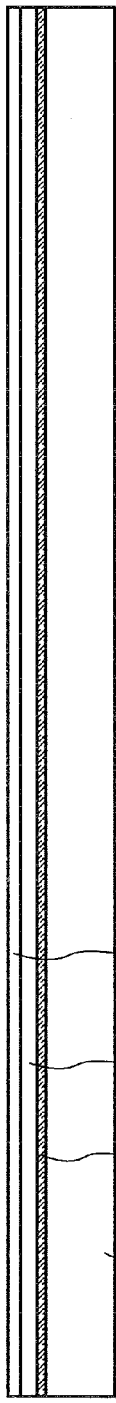
FIGS. 6A to 6C are diagrams illustrating a method for manufacturing a semiconductor device.
Figure 6B:
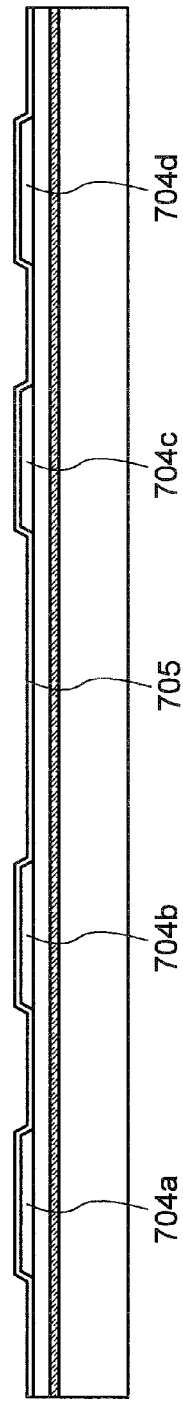
Figure 6C:
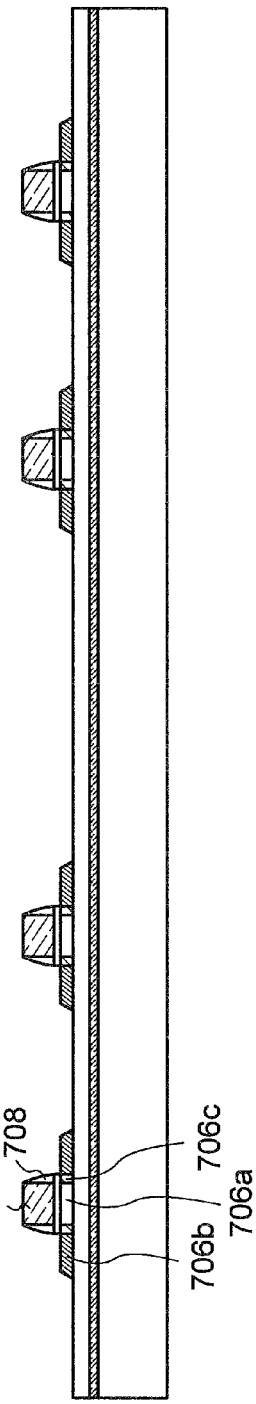

First, a separation layer 702 is formed on a surface of a substrate 701, and an insulating film 703 serving as a base and a semiconductor film 704 (e.g., a film containing amorphous silicon) are formed (see FIG. 6A). The separation layer 702, the insulating film 703, and the semiconductor film 704 can be formed continuously, which can prevent impurities from entering because the films are not exposed to the atmosphere.

As the substrate 701, a glass substrate, a quartz substrate, a metal substrate, a stainless steel substrate, a plastic substrate having heat resistance to the processing temperature of this process, or the like may be used. Such a substrate is not particularly limited in area and shape. For example, by using a rectangular substrate with a side of 1 meter or longer, productivity can be significantly increased. This is a major advantage as compared to the case of using a circular silicon substrate. Thus, even when a semiconductor integrated circuit portion occupies a larger area, production cost can be reduced as compared to the case of using a silicon substrate.

Note that the separation layer 702 is formed over the entire surface of the substrate 701 in this process; however, after a separation layer is formed over the entire surface of the substrate 701, the separation layer 702 may be selectively formed by photolithography as needed. In addition, although the separation layer 702 is formed in contact with the substrate 701, an insulating film such as a silicon oxide film, a silicon oxynitride film, a silicon nitride film, or a silicon nitride oxide film may be formed in contact with the substrate 701 as needed, and the separation layer 702 may be formed in contact with the insulating film.

Here, oxynitride refers to a substance that contains more oxygen than nitrogen, and nitride oxide refers to a substance that contains nitrogen than oxygen. For example, silicon oxynitride is a substance containing oxygen, nitrogen, silicon, and hydrogen at concentrations ranging from 50 atomic % to 70 atomic %, 0.5 atomic % to 15 atomic %, 25 atomic % to 35 atomic %, and 0.1 atomic % to 10 atomic %, respectively. Furthermore, silicon nitride oxide is a substance containing oxygen, nitrogen, silicon, and hydrogen at concentrations ranging from 5 atomic % to 30 atomic %, 20 atomic % to 55 atomic %, 25 atomic % to 35 atomic %, and 10 atomic % to 30 atomic %, respectively. Note that the above concentration ranges are obtained when measurements are performed using Rutherford backscattering spectrometry (RBS) or hydrogen forward scattering (HFS). In addition, the total of the percentages of the constituent elements does not exceed 100 atomic %.

As the separation layer 702, a metal film, a multi-layer structure of a metal film and a metal oxide film, or the like may be used. The metal film has a single-layer structure or a multi-layer structure of a film made of an element selected from tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), and iridium (Ir), an alloy containing such an element as its main component, or a compound containing such an element as its main component. Those materials can be formed by various deposition methods such as sputtering, evaporation, or plasma CVD. As the multi-layer structure of a metal film and a metal oxide film, after the aforementioned metal film is formed, oxide or oxynitride of the metal film can be formed on the surface of the metal film by performing plasma treatment in an oxygen atmosphere or an $N_2O$ atmosphere, or heat treatment in an oxygen atmosphere or an $N_2O$ atmosphere. Alternatively, after the metal film is formed, the surface of the metal film may be subjected to treatment with a highly oxidizing solution such as ozone water, whereby oxide or oxynitride of the metal film can be provided on the surface of the metal film.

The insulating film 703 has a single-layer structure or a multi-layer structure of a film containing oxide of silicon or nitride of silicon formed by sputtering, plasma CVD, or the like. If the insulating film serving as a base has a two-layer structure, for example, a silicon nitride oxide film may be formed as a first layer and a silicon oxynitride film may be formed as a second layer. If the insulating film serving as a base has a three-layer structure, a silicon oxide film, a silicon nitride oxide film, and a silicon oxynitride film may be formed as a first layer, a second layer, and a third layer, respectively. Alternatively, a silicon oxynitride film, a silicon nitride oxide film, and a silicon oxynitride film may be formed as a first layer, a second layer, and a third layer, respectively. The insulating film serving as a base functions as a blocking film to prevent impurities from entering from the substrate 701.

The semiconductor film 704 is formed by sputtering, LPCVD, plasma CVD, or the like to a thickness of about 25 nm to 200 nm (preferably, about 30 nm to 150 nm). As the semiconductor film 704, for example, an amorphous silicon film may be formed. Note that the semiconductor material that can be used for the semiconductor film 704 is not limited to silicon. For example, an organic semiconductor or an oxide semiconductor can also be used.

Next, the semiconductor film 704 is irradiated with laser light to be crystallized. Note that the semiconductor film 704 may be crystallized by combining laser light irradiation, thermal crystallization using RTA or an annealing furnace, thermal crystallization using a metal element that promotes crystallization, and the like. Then, the obtained crystalline semiconductor film is etched into a desired shape, whereby a semiconductor film 704a, a semiconductor film 704b, a semiconductor film 704c, and a semiconductor film 704d are formed, and a gate insulating film 705 is formed to cover the semiconductor films 704a to 704d (see FIG. 6B).

An example of a manufacturing process of the semiconductor films 704a to 704d will be briefly described below. First, an amorphous semiconductor film (e.g., an amorphous silicon film) with a thickness of about 50 nm is formed by plasma CVD. After the amorphous semiconductor film is coated with a solution containing nickel that is a metal element promoting crystallization, the amorphous semiconductor film is subjected to dehydrogenation treatment (at 500° C. for one hour) and thermal crystallization treatment (for 550° C. for four hours), whereby a crystalline semiconductor film is formed. Then, the crystalline semiconductor film is irradiated with laser light from a laser, and the semiconductor films 704a to 704d are formed by photolithography. Note that the thermal crystallization using a metal element that promotes crystallization is not necessarily conducted, and the amorphous semiconductor film may be crystallized only by laser light irradiation.

Next, the gate insulating film 705 is formed to cover the semiconductor films 704a to 704d. The gate insulating film 705 has a single-layer structure or a multi-layer structure of a film containing oxide of silicon or nitride of silicon formed by CVD, sputtering, or the like. Specifically, the gate insulating film 705 has a single-layer structure or a multi-layer structure of a silicon oxide film, a silicon oxynitride film, or a silicon nitride oxide film.

Alternatively, the gate insulating film 705 may be formed by oxidizing or nitriding the surfaces of the semiconductor films 704a to 704d by plasma treatment. For example, the gate insulating film 705 is formed by plasma treatment with a mixed gas of a rare gas such as He, Ar, Kr or Xe, and oxygen, nitrogen oxide ($NO_2$), ammonia, nitrogen, hydrogen, or the like. In that case, plasma is excited by microwaves, so that plasma with a low electron temperature and a high density can be generated. The surfaces of the semiconductor films can be oxidized or nitrided by oxygen radicals (that may include OH radicals) or nitrogen radicals (that may include NH radicals), which are generated by the high-density plasma.

By treatment with such high-density plasma, an insulating film having a thickness of about 1 nm to 20 nm, typically about 5 nm to 10 nm is formed over the semiconductor films. Since the reaction in that case is a solid-phase reaction, the interface state density between the insulating film and the semiconductor films can be significantly decreased. The semiconductor films (crystalline silicon or polycrystalline silicon) are directly oxidized (or nitrided) by such plasma treatment, whereby variation in the thickness of the insulating film to be formed can be considerably reduced. In addition, oxidation does not proceed even at the crystal grain boundaries of crystalline silicon, which makes a very preferable condition. That is, by the solid-phase oxidation of the surfaces of the semiconductor films with the high-density plasma treatment described here, an insulating film with good uniformity and low-interface state density can be formed without excessive oxidation reaction at crystal grain boundaries.

As the gate insulating film 705, only an insulating film formed by the plasma treatment may be used or an insulating film made of silicon oxide, silicon oxynitride, or silicon nitride may be additionally stacked thereover by CVD using plasma or thermal reaction. In any case, if an insulating film formed by the plasma treatment is included in a part or the whole of a gate insulating film of a transistor, variation in the characteristics of the transistor can be reduced.

Furthermore, the semiconductor films 704a to 704d, which are obtained by crystallization by irradiation with a continuous-wave laser beam or a laser beam having a repetition rate of 10 MHz or more, have characteristics that crystals grow in the scanning direction of the laser light. By placing a transistor so that the scanning direction is aligned with the channel-length direction (the direction in which carriers flow when a channel formation region is formed) and combining the transistor with the aforementioned gate insulating layer, a thin film transistor (TFT) with fewer variations in characteristics and high field-effect mobility can be obtained.

Next, a conductive film is formed over the gate insulating film 705. Here, a single conductive layer with a thickness of about 100 nm to 500 nm is formed. The conductive layer can be made of a material containing an element selected from tantalum (Ta), tungsten (W), titanium (Ti), molybdenum (Mo), aluminum (Al), copper (Cu), chromium (Cr), niobium (Nb), and the like, an alloy containing such an element as its main component, or a compound containing such an element as its main component. Alternatively, a semiconductor material typified by polycrystalline silicon doped with an impurity element such as phosphorus may be used. In the case where the conductive film has a multi-layer structure, for example, it is possible to use a multi-layer structure of a tantalum nitride film and a tungsten film, a multi-layer structure of a tungsten nitride film and a tungsten film, or a multi-layer structure of a molybdenum nitride film and a molybdenum film. Since tungsten and tantalum nitride have high heat resistance, heat treatment for thermal activation can be performed after the conductive film is formed. The conductive film may have a multi-layer structure of three or more layers, and for example, a multi-layer structure of a molybdenum film, an aluminum film, and a molybdenum film may be used.

Next, a resist mask is formed over the above conductive film by photolithography and etching is performed for forming a gate electrode and a gate wiring, whereby gate electrodes 707 are formed over the semiconductor films 704a to 704d.

Then, a resist mask is formed by photolithography and an impurity element imparting n-type or p-type conductivity is added to the semiconductor films 704a to 704d at a low concentration. In this embodiment, an impurity element imparting n-type conductivity is added to the semiconductor films 704a to 704d at a low concentration. As the impurity element imparting n-type conductivity, an element belonging to Group 15, for example, phosphorus (P) or arsenic (As) can be used. As the impurity element imparting p-type conductivity, an element belonging to Group 13, for example, boron (B) can be used. Note that the impurity element may be added by ion doping, ion implantation, or the like.

Although only the n-type TFTs are shown in this embodiment for simplicity, the present invention is not limited to this structure. Only p-type TFTs may be used, or n-type TFTs and p-type TFTs may be formed in combination. In the case where n-type TFTs and p-type TFTs are formed in combination, an impurity element imparting n-type conductivity is added using a mask covering semiconductor layers that are to be included in p-type TFTs, and an impurity element imparting p-type conductivity is added using a mask covering semiconductor layers that are to be included in n-type TFTs, whereby the impurity element imparting n-type conductivity and the impurity element imparting p-type conductivity can be selectively added.

Next, an insulating film is formed to cover the gate insulating film 705 and the gate electrodes 707. The insulating film has a single-layer structure or a multi-layer structure of a film containing an inorganic material such as silicon, oxide of silicon, or nitride of silicon, or a film containing an organic material such as an organic resin, which is formed by CVD, sputtering, or the like. Then, the insulating film is selectively etched by anisotropic etching performed mainly in a perpendicular direction, whereby insulating films 708 (also referred to as sidewalls) touching the side surfaces of the gate electrodes 707 are formed. The insulating films 708 are used as masks when an impurity element is added later for forming LDD (lightly doped drain) regions.

Next, an impurity element imparting n-type conductivity is added to the semiconductor films 704a to 704d using a resist mask formed by photolithography, the gate electrodes 707, and the insulating films 708 as masks. As a result, a channel formation region 706a, first impurity regions 706b, and second impurity regions 706c are formed (see FIG. 6C). The first impurity regions 706b function as source and drain regions of thin film transistors, and the second impurity regions 706c function as LDD regions. The concentration of the impurity element contained in the second impurity regions 706c is lower than that of the impurity element contained in the first impurity regions 706b.

Then, an insulating film having a single-layer structure or a multi-layer structure is formed to cover the gate electrodes 707 and the insulating films 708. The insulating film can be formed of an inorganic material such as oxide of silicon or nitride of silicon, an organic material such as polyimide, polyamide, benzocyclobutene, acrylic, or epoxy, a siloxane material, or the like by CVD, sputtering, SOG, droplet discharging, screen printing, or the like. This embodiment shows an example of a two-layer structure of an insulating film 709 made of silicon nitride and an insulating film 710 made of silicon oxynitride.

After the insulating films 709 and 710 and the like are etched by photolithography to form contact holes reaching the first impurity regions 706b, conductive films 731 functioning as source and drain electrodes of the thin film transistors are formed. The conductive films 731 can be formed by forming a conductive film so as to fill the contact holes and selectively etching the conductive film. Note that, before the conductive film is formed, silicide may be formed on the surfaces of the semiconductor films 704a to 704d, which are exposed in the contact holes. Through the above steps, an element layer 751 including a thin film transistor 730a, a thin film transistor 730b, a thin film transistor 730c, and a thin film transistor 730d is obtained (see FIG. 7A).

Note that, before the insulating film 709 and the insulating film 710 are formed, or after one of or both the insulating film 709 and the insulating film 710 is formed, heat treatment is preferably performed to recover the crystallinity of the semiconductor film 704, activate the impurity element added to the semiconductor film, and hydrogenate the semiconductor film. The heat treatment may be performed by thermal annealing, laser annealing, RTA, or the like.

The conductive films 731 have a single-layer structure or a multi-layer structure of a film containing a material selected from aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), and silicon (Si), an alloy containing such an element as its main component, or a compound containing such an element as its main component, which is formed by CVD, sputtering, or the like. The alloy containing aluminum as its main component corresponds to, for example, a material that contains aluminum as its main component and also contains nickel, or an alloy material that contains aluminum as its main component and also contains nickel and one or both of carbon and silicon.

Next, an insulating film 711 is formed to cover the conductive films 731, and openings 712a and 712b are formed in the insulating film 711 (see FIG. 7B). Here, the openings 712a and 712b are formed to expose the conductive films 731 functioning as the source and drain electrodes of the thin film transistors 730b and 730d. The insulating film 711 has a single-layer structure or a multi-layer structure of a film containing an inorganic material or an organic material, which is formed by CVD, sputtering, SOG, droplet discharging, screen printing, or the like. It is preferable that the insulating film 711 have a thickness of about 0.75 µm to 3 µm.

Next, a conductive film 713 functioning as an antenna is formed over the insulating film 711, and an insulating film 714 is formed over the conductive film 713 (see FIG. 7C).

The conductive film 713 functioning as an antenna is formed of a conductive material by CVD, sputtering, a printing method such as screen printing or gravure printing, droplet discharging, dispensing, plating, or the like. Alternatively, the conductive film 713 functioning as an antenna may have a single-layer structure or a multi-layer structure using, as a conductive material, a metal element such as aluminum, titanium, silver, copper, gold, platinum, nickel, palladium, tantalum, or molybdenum, an alloy containing such a metal element, or a compound containing such a metal element.

For example, in the case where the conductive film 713 functioning as an antenna is formed by screen printing, the conductive film can be formed by selectively printing a conductive paste in which conductive particles having a diameter of several nanometers to several tens of micrometers are dissolved or dispersed in an organic resin. As the conductive particles, it is possible to use metal particles such as silver, gold, copper, nickel, platinum, palladium, tantalum, molybdenum, or titanium, fine particles of silver halide, dispersive nanoparticles, or the like. As the organic resin contained in the conductive paste, one or more of organic resins functioning as a binder, a solvent, a dispersant, and a coating material for metal particles can be used. Typically, an organic resin such as an epoxy resin or a silicone resin can be used. Alternatively, fine particles that contain solder or lead-free solder as its main component may be used. In that case, it is preferable to use fine particles having a diameter of 20 µm or less. Solder and lead-free solder have an advantage of low cost.

The insulating film 714 can be made of, for example, an insulating material such as silicon oxide, silicon oxynitride, silicon nitride, or silicon nitride oxide. In this embodiment, silicon nitride is used for the insulating film 714.

Next, a first insulator 715 is formed to cover the insulating film 714 (see FIG. 8A).

As the first insulator 715, it is possible to use a thermosetting resin such as an epoxy resin, an unsaturated polyester resin, a polyimide resin, a bismaleimide-triazine resin, or a cyanate resin. Alternatively, a thermoplastic resin such as a polyphenylene oxide resin, a polyetherimide resin, or a fluorine resin may be used as the first insulator 715.

In this embodiment, a structure body in which a fibrous body 715a is impregnated with an organic resin 715b is used as the first insulator 715.

The aforementioned structure body in which the fibrous body 715a is impregnated with the organic resin 715b is also referred to as a prepreg. The prepreg is specifically obtained in such a manner that a fibrous body is impregnated with a varnish in which a matrix resin is diluted with an organic solvent, and then the organic solvent is volatilized so that the matrix resin is semi-cured. The thickness of the structure body is preferably 5 µm to 100 µm, and more preferably 10 µm to 30 µm. By using the structure body with such a thickness, a thin semiconductor device capable of being curved can be manufactured. For example, a prepreg having a modulus of elasticity of 13 GPa to 15 GPa and a modulus of rupture of 140 MPa can be used as the insulator. The prepreg will be described in detail in the following embodiment.

Note that the first insulator 715 may have a single-layer structure or a multi-layer structure. In the case of a multi-layer structure, the above insulators may be selected as appropriate to be stacked.

Next, the organic resin 715b is cured, and then a first conductive layer 716 is formed on the surface of the first insulator 715 (see FIG. 8B). The first conductive layer 716 can be formed by, for example, sputtering, plasma CVD, vacuum evaporation, coating, or printing using a material containing an element selected from titanium, molybdenum, tungsten, aluminum, copper, silver, gold, nickel, tin, platinum, palladium, iridium, rhodium, tantalum, cadmium, zinc, iron, silicon, germanium, zirconium, and barium, an alloy containing such an element as its main component, or a compound containing such an element as its main component. The first conductive layer 716 may also be formed by plating such as electrolytic plating or electroless plating. Note that an insulating layer may be formed on the surface of the first conductive layer 716, which allows the first conductive layer 716 to be protected.

Figure 9A:
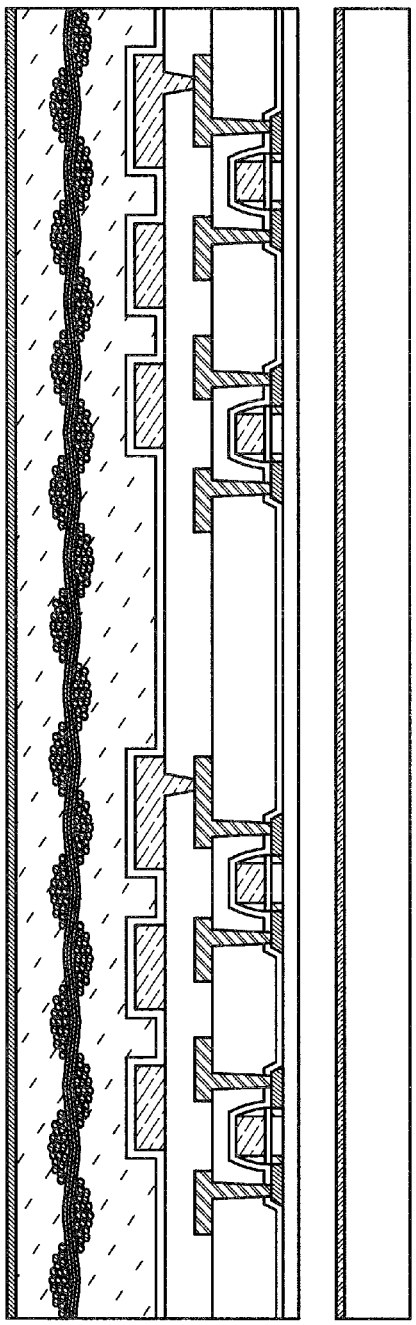
FIGS. 9A and 9B are diagrams illustrating a method for manufacturing a semiconductor device.

Next, an element layer including the thin film transistors 730a to 730d, the conductive film 713 functioning as an antenna, and the like is separated from the substrate 701 (see FIG. 9A).

Note that the separation is preferably performed while wetting the separation surface with water or a solution such as ozone water, so that the elements such as the thin film transistors 730a to 730d can be prevented from being damaged by static electricity and the like. In addition, lower cost can be realized by reusing the substrate 701 after the separation.

Figure 9B:
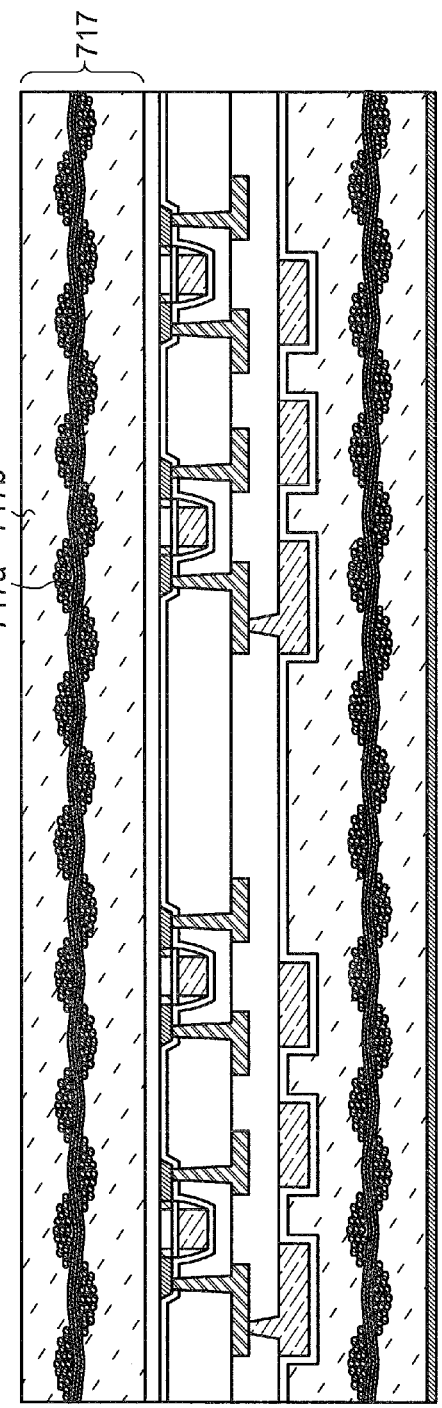

Next, a second insulator 717 is formed to cover the surface exposed by the separation (see FIG. 9B). The second insulator 717 can be formed in a manner similar to the first insulator 715. In this embodiment, a structure body in which a fibrous body 717a is impregnated with an organic resin 717b is used as the second insulator 717. Note that, like the first insulator 715, the second insulator 717 may have a single-layer structure or a multi-layer structure.

Next, the organic resin 717b is cured, and then a second conductive layer 718 is formed on the surface of the second insulator 717 (see FIG. 10A). The second conductive layer 718 can be formed in a manner similar to the first conductive layer 716. Note that an insulating layer may be formed on the surface of the second conductive layer 718, which allows the second conductive layer 718 to be protected. Through the above steps, a layered structure can be obtained in which the element layer is sealed between the first insulator 715 and the second insulator 717, the first conductive layer 716 is formed on the surface of the first insulator 715, and the second conductive layer 718 is formed on the surface of the second insulator 717.

Then, the aforementioned structure is divided into separate semiconductor devices (see FIG. 10B). As a dividing means, it is preferable to use a means to melt the first insulator 715 and the second insulator 717 in dividing (it is more preferable to use a means to melt the first conductive layer 716 and the second conductive layer 718). In this embodiment, laser light irradiation is used for dividing the semiconductor devices.

There is no particular limitation on the conditions, such as wavelength, intensity, and beam size of the laser light used for the dividing of the semiconductor devices. The laser light irradiation may be performed under such conditions that the semiconductor devices can be divided. As a laser beam, it is possible to use, for example, a continuous-wave laser beam emitted from a laser such as an Ar laser, a Kr laser, a $CO_2$ laser, a YAG laser, a $YVO_4$ laser, a YLF laser, a $YAlO_3$ laser, a $GdVO_4$ laser, a $Y_2O_3$ laser, a ruby laser, an alexandrite laser, a Ti:sapphire laser, or a helium-cadmium laser; or a pulsed laser beam emitted from a laser such as an Ar laser, a Kr laser, an excimer (ArF, KrF, or XeCl) laser, a $CO_2$ laser, a YAG laser, a $YVO_4$ laser, a YLF laser, a $YAlO_3$ laser, a $GdVO_4$ laser, a $Y_2O_3$ laser, a ruby laser, an alexandrite laser, a Ti:sapphire laser, a copper vapor laser, or a gold vapor laser.

As described in this embodiment, by dividing the semiconductor devices into separate devices by laser light irradiation, the resistance between the first conductive layer 716 and the second conductive layer 718 is decreased, whereby the first conductive layer 716 and the second conductive layer 718 are electrically connected to each other. Accordingly, the step of dividing the semiconductor devices and the step of electrically connecting the first conductive layer 716 and the second conductive layer 718 can be performed at a time.

The resistance between the first conductive layer 716 and the second conductive layer 718 may be, for example, 1 GΩ or less, preferably about 5 MΩ to 500 MΩ, and more preferably about 10 MΩ to 200 MΩ. Therefore, dividing of the semiconductor devices may be performed by laser light irradiation or the like so that such a resistance can be obtained.

Note that the element layer is sealed without being divided in this embodiment; however, the embodiment of the disclosed invention is not limited to this structure. For example, the element layer having the semiconductor integrated circuit and the antenna may be sealed after being divided. Furthermore, although the first conductive layer (or the second conductive layer) is formed after the first insulator (or the second insulator) is formed in this embodiment, the embodiment of the disclosed invention is not limited to this structure. For example, in the case where a substrate that has been cured is used as the first insulator (or the second insulator), a semiconductor device can be manufactured using a layered structure in which the first conductive layer (or the second conductive layer) is formed on the surface of the first insulator (or the second insulator).

This embodiment can be implemented in appropriate combination with the other embodiments.

[Embodiment 3]

In this embodiment, as an example of an insulator sealing a semiconductor element, a structure body in which a fibrous body is impregnated with an organic resin will be described in detail with reference to FIG. 11.

Figure 11:
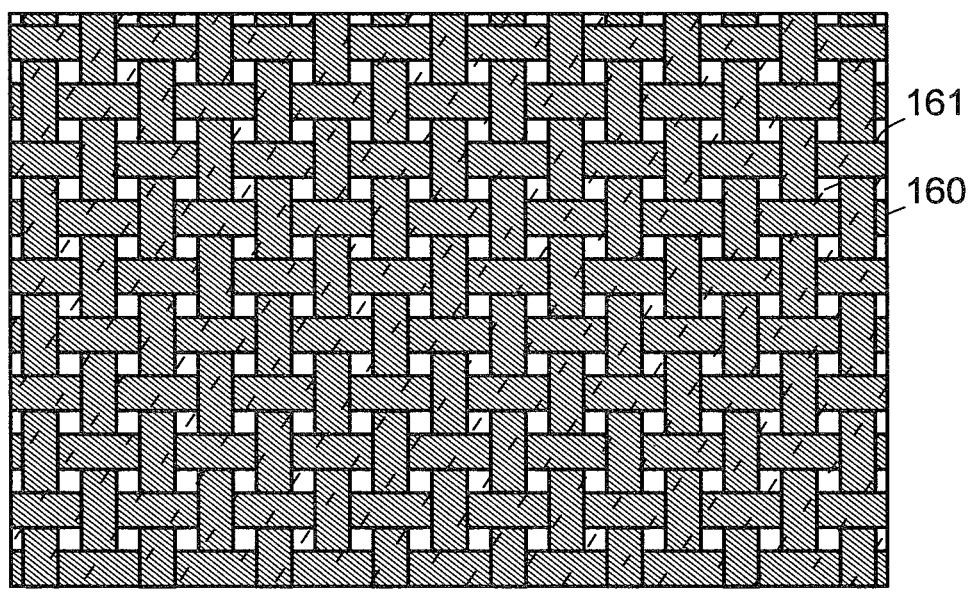
FIG. 11 is a diagram illustrating a structure body.

A fibrous body 160 is woven from warp yarns spaced at regular intervals and weft yarns spaced at regular intervals (see FIG. 11). The fibrous body woven from warp yarns and weft yarns includes regions where neither warp yarns nor weft yarns exist. Such a fibrous body 160 is more easily impregnated with the organic resin 161, which results in an increase in the adhesion between the fibrous body 160 and a semiconductor integrated circuit.

The fibrous body 160 may have a higher density of warp yarns and weft yarns and a smaller region where neither warp yarns nor weft yarns exist.

The structure body in which the fibrous body 160 is impregnated with the organic resin 161 is also referred to as a prepreg. The prepreg is specifically obtained in such a manner that a fibrous body is impregnated with a varnish in which a matrix resin is diluted with an organic solvent, and then the organic solvent is volatilized so that the matrix resin is semi-cured. As the prepreg, for example, fibrous bodies that are placed on a plane surface and made of glass or the like may be woven to cross each other into fabric form and the woven fabric may be impregnated with an organic resin. In that case, expansion and contraction of the fibrous body in the surface direction can be suppressed and flexibility in the direction perpendicular to the surface direction can be obtained. The thickness of the structure body is preferably 10 μm to 100 μm, and more preferably 10 μm to 30 μm. By using the structure body with such a thickness, a thin semiconductor device capable of being curved can be manufactured. For example, a prepreg having a modulus of elasticity of 13 GPa to 15 GPa and a modulus of rupture of 140 MPa can be used as the insulators.

As the organic resin 161, it is possible to use a thermosetting resin such as an epoxy resin, an unsaturated polyester resin, a polyimide resin, a bismaleimide-triazine resin, or a cyanate resin. Alternatively, a thermoplastic resin such as a polyphenylene oxide resin, a polyetherimide resin, or a fluorine resin may also be used as the organic resin 161. With use of the above organic resin, the fibrous body 160 can be firmly bonded to the semiconductor integrated circuit by heat treatment. Note that the higher the glass transition temperature of the organic resin 161 is, the less the organic resin 161 is damaged by local pressing force, which is preferable.

Highly thermally-conductive filler may be dispersed in the organic resin 161 or the yarn bundles of fibers. As the highly thermally-conductive filler, there are insulating particles such as aluminum nitride, boron nitride, silicon nitride, or alumina, and metal particles such as silver or copper. When the highly thermally-conductive filler is included in the organic resin or the yarn bundles of fibers, heat generated in the semiconductor integrated circuit can be easily released to the outside. Accordingly, thermal storage in the semiconductor device can be suppressed and thus damage to the semiconductor device can be effectively prevented.

The fibrous body 160 is a woven or nonwoven fabric using high-strength fibers of an organic compound or an inorganic compound. A high-strength fiber is specifically a fiber with a high tensile modulus of elasticity or a fiber with a high Young's modulus. As typical examples of a high-strength fiber, there are a polyvinyl alcohol fiber, a polyester fiber, a polyamide fiber, a polyethylene fiber, an aramid fiber, a poly-paraphenylene benzobisoxazole fiber, a glass fiber, a carbon fiber, and the like. As a glass fiber, there is a glass fiber using E glass, S glass, D glass, Q glass, or the like. Note that the fibrous body 160 may be formed of one kind of the above high-strength fibers or plural kinds of the above high-strength fibers.

The fibrous body 160 may be a woven fabric that is woven from bundles of fibers (single yarns) (hereinafter referred to as yarn bundles) used for warp yarns and weft yarns, or a nonwoven fabric obtained by stacking yarn bundles of plural kinds of fibers randomly or regularly. In the case of a woven fabric, a plain-woven fabric, a twilled fabric, a satin-woven fabric, or the like can be used as appropriate.

The yarn bundle may have a circular shape or an elliptical shape in cross section. As the yarn bundle of fibers, a yarn bundle of fibers may be used which has been subjected to fiber opening with a high-pressure water stream, high-frequency vibration using liquid as a medium, continuous ultrasonic vibration, pressing with a roller, or the like. The yarn bundle of fibers which has been subjected to fiber opening has a large width and has an elliptical shape or a flat shape in cross section. As a result, the number of single yarns in the thickness direction can be reduced. Furthermore, with use of a loosely twisted yarn as the yarn bundle of fibers, the yarn bundle is easily flattened and has an elliptical shape or a flat shape in cross section. By using such a yarn bundle having an elliptical shape or a flat shape in cross section, the thickness of the fibrous body 160 can be reduced. Accordingly, a thin semiconductor device can be manufactured.

By using the aforementioned structure body as the insulator sealing the element layer, the resistance of the semiconductor device to external stress can be increased. Furthermore, damages or deterioration in characteristics can be prevented from being generated in the process of applying pressure, or the like. Therefore, the semiconductor device can be manufactured at high yield.

Note that this embodiment can be implemented in appropriate combination with the structures or manufacturing methods shown in the other embodiments of this specification.

[Embodiment 4]

In this embodiment, an example of a semiconductor device will be described, which is intended to have higher reliability. Specifically, examples of a microprocessor and a semiconductor device that has an arithmetic function and can wirelessly transmit and receive data will be described as examples of the semiconductor device.

Figure 12:
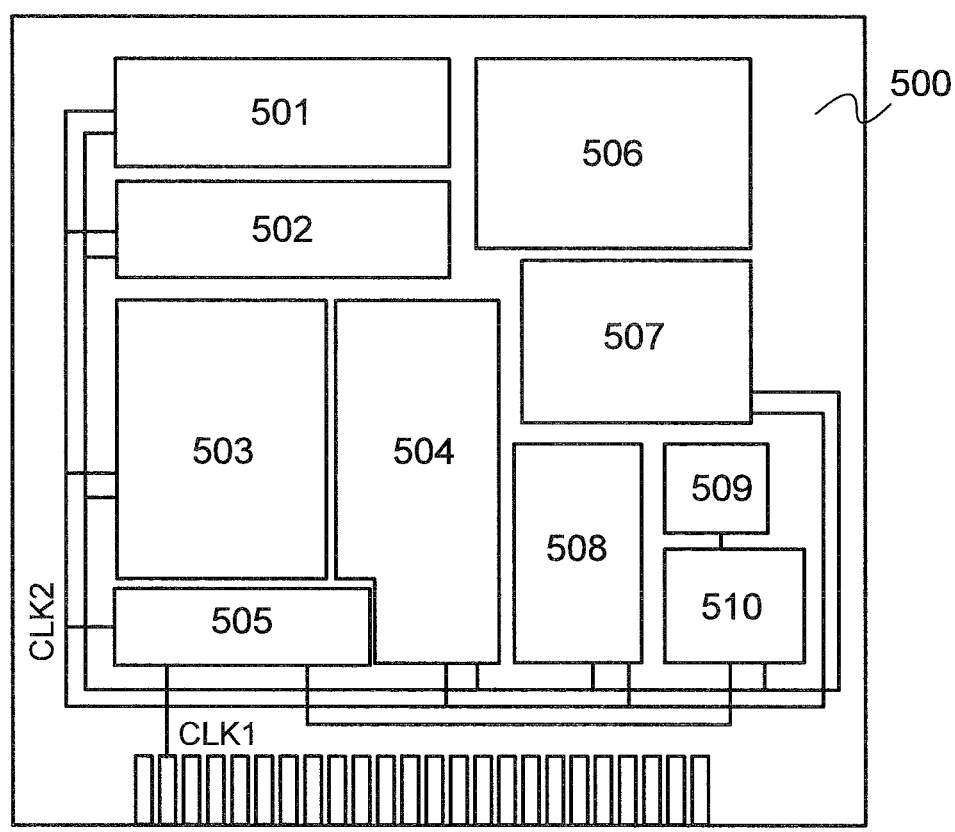
FIG. 12 is a diagram illustrating a semiconductor device.

FIG. 12 illustrates a microprocessor 500 as an example of the semiconductor device. The microprocessor 500 is manufactured using the semiconductor device shown in the above embodiments. The microprocessor 500 includes an arithmetic logic unit (ALU) 501, an ALU controller 502, an instruction decoder 503, an interrupt controller 504, a timing controller 505, a register 506, a register controller 507, a bus interface (Bus I/F) 508, a read only memory (ROM) 509, and a memory interface (ROM I/F) 510.

An instruction input to the microprocessor 500 via the bus interface 508 is input to the instruction decoder 503, decoded therein, and then input to the ALU controller 502, the interrupt controller 504, the register controller 507, and the timing controller 505. The ALU controller 502, the interrupt controller 504, the register controller 507, and the timing controller 505 conduct various controls based on the decoded instruction. Specifically, the ALU controller 502 generates signals for controlling the operation of the ALU 501. While the microprocessor 500 is executing a program, the interrupt controller 504 judges and processes an interrupt request from an external input/output device or a peripheral circuit based on its priority or a mask state. The register controller 507 generates an address of the register 506, and reads/writes data from/to the register 506 in accordance with the state of the microprocessor 500. The timing controller 505 generates signals for controlling the timing of operation of the ALU 501, the ALU controller 502, the instruction decoder 503, the interrupt controller 504, and the register controller 507. For example, the timing controller 505 is provided with an internal clock generator for generating an internal clock signal CLK2 based on a reference clock signal CLK1, and supplies the internal clock signal CLK2 to the aforementioned various circuits. Note that the microprocessor 500 illustrated in FIG. 12 is only an example having a simplified configuration, and practical microprocessors can have a variety of configurations depending on the application.

Figure 13:
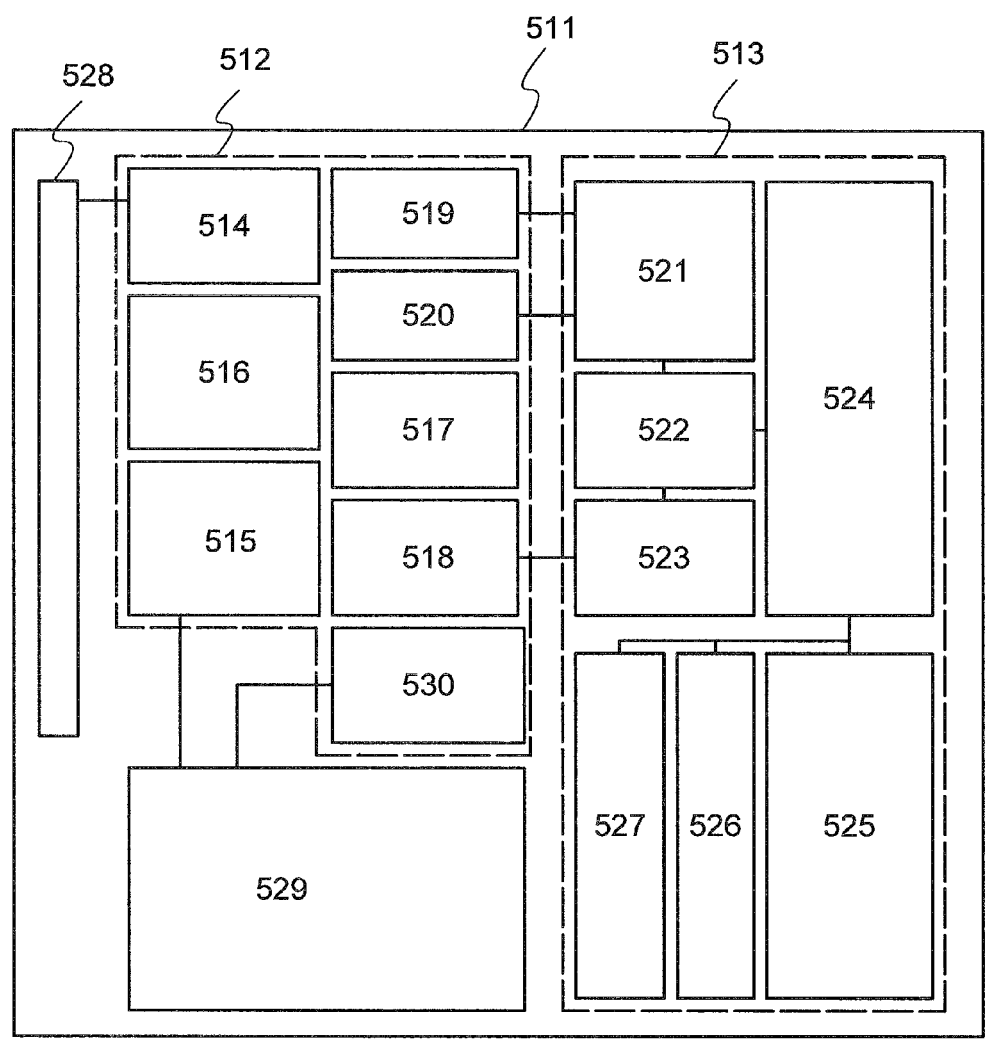
FIG. 13 is a diagram illustrating a semiconductor device.

Next, an example of a semiconductor device having an arithmetic function and capable of wirelessly transmitting and receiving data will be described with reference to FIG. 13. FIG. 13 illustrates an example of a computer (hereinafter referred to as an RFCPU) that operates by transmitting/receiving signals to/from an external device by wireless communication. An RFCPU 511 includes an analog circuit portion 512 and a digital circuit portion 513. The analog circuit portion 512 includes a resonance circuit 514 having a resonant capacitor, a rectifier circuit 515, a constant voltage circuit 516, a reset circuit 517, an oscillator circuit 518, a demodulation circuit 519, a modulation circuit 520, and a power supply control circuit 530. The digital circuit portion 513 includes an RF interface 521, a control register 522, a clock controller 523, a CPU interface 524, a central processing unit 525, a random access memory 526, and a read only memory 527.

The operation of the RFCPU 511 having such a configuration is roughly described below. The resonance circuit 514 generates induced electromotive force based on a signal received by an antenna 528. The induced electromotive force is stored in a capacitor portion 529 via the rectifier circuit 515. The capacitor portion 529 preferably includes a capacitor such as a ceramic capacitor or an electric double layer capacitor. The capacitor portion 529 is not necessarily integrated over the same substrate as the RFCPU 511 and may be attached as another component to a substrate having an insulating surface over which the RFCPU 511 is formed.

The reset circuit 517 generates a signal that resets and initializes the digital circuit portion 513. For example, a signal that rises after an increase in power supply voltage is generated as the reset signal. The oscillator circuit 518 changes the frequency and duty ratio of a clock signal in accordance with a control signal generated by the constant voltage circuit 516. The demodulation circuit 519 including a low-pass filter binarizes, for example, changes in amplitude of a received signal of an amplitude shift keying (ASK) system. The modulation circuit 520 changes the amplitude of a transmission signal of the amplitude shift keying (ASK) system and transmits data. The modulation circuit 520 changes the resonance point of the resonance circuit 514, thereby varying the amplitude of a communication signal. The clock controller 523 generates a control signal for changing the frequency and duty ratio of the clock signal in accordance with the power supply voltage or the current consumption in the central processing unit 525. The power supply voltage is monitored by the power supply control circuit 530.

A signal that is input to the RFCPU 511 from the antenna 528 is demodulated by the demodulation circuit 519, and then divided into a control command, data, and the like by the RF interface 521. The control command is stored in the control register 522. The control command includes reading of data stored in the read only memory 527, writing of data to the random access memory 526, an arithmetic instruction to the central processing unit 525, and the like. The central processing unit 525 accesses the read only memory 527, the random access memory 526, and the control register 522 via the CPU interface 524. The CPU interface 524 has a function of generating an access signal to any one of the read only memory 527, the random access memory 526, and the control register 522 based on an address requested by the central processing unit 525.

As an arithmetic method of the central processing unit 525, a method may be employed in which an OS (operating system) is stored in the read only memory 527 and a program is read and executed at the time of starting operation. Alternatively, a method may also be employed in which a dedicated arithmetic circuit is formed and an arithmetic operation is conducted using hardware. In a method using both hardware and software, part of the arithmetic operation can be conducted by a dedicated arithmetic circuit, and the other part can be conducted by the central processing unit 525 using a program.

Also in the microprocessor of this embodiment, the conductive layer provided on the surface of the circuit prevents electrostatic breakdown of the semiconductor integrated circuit (malfunction of the circuit, damage to the semiconductor elements, and the like) due to electrostatic discharge. As a result, a semiconductor device in which deterioration in characteristics due to electrostatic discharge is reduced can be manufactured at high yield.

Note that this embodiment can be implemented in appropriate combination with the structures or manufacturing methods shown in the other embodiments of this specification.

[Embodiment 5]

In this embodiment, an example of the application of the semiconductor devices shown in the above embodiments will be described. Specifically, an example of the application of a semiconductor device capable of wirelessly transmitting and receiving data is described with reference to drawings. The semiconductor device capable of wirelessly transmitting and receiving data is also called an RFID tag, an ID tag, an IC tag, an RF tag, a wireless tag, an electronic tag, or a wireless chip depending on the application.

An example of a top view of a semiconductor device shown in this embodiment is described with reference to FIG. 14A. The semiconductor device illustrated in FIG. 14A includes a semiconductor integrated circuit chip 400 having an antenna (also referred to as an on-chip antenna) and a supporting substrate 406 having an antenna 405 (also referred to as a booster antenna). The semiconductor integrated circuit chip 400 is provided over an insulating layer 410 that is formed over the supporting substrate 406 and the antenna 405.

A semiconductor integrated circuit provided in the semiconductor integrated circuit chip 400 includes a plurality of elements such as transistors constituting a memory portion or a logic portion. As the semiconductor elements of the semiconductor device shown in this embodiment, not only a field effect transistor but also a memory element using a semiconductor layer or the like may be employed. As a result, a semiconductor device having functions required for various applications can be manufactured and provided.

Figure 14A:
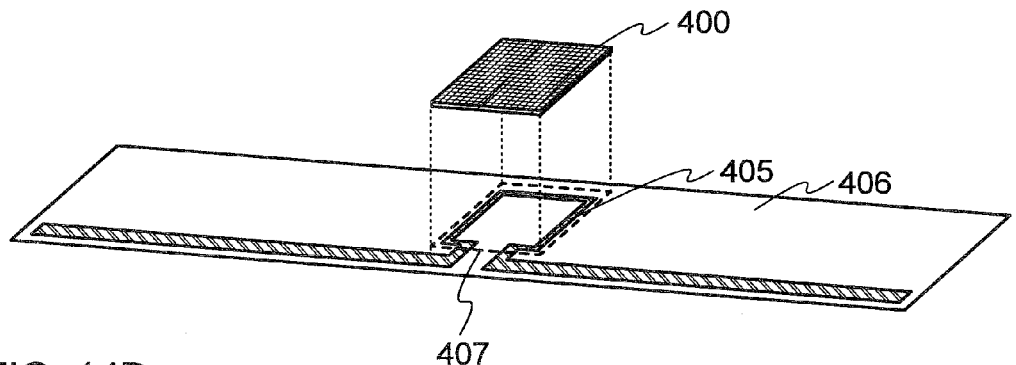
FIGS. 14A to 14C are diagrams illustrating a semiconductor device.
Figure 15A:
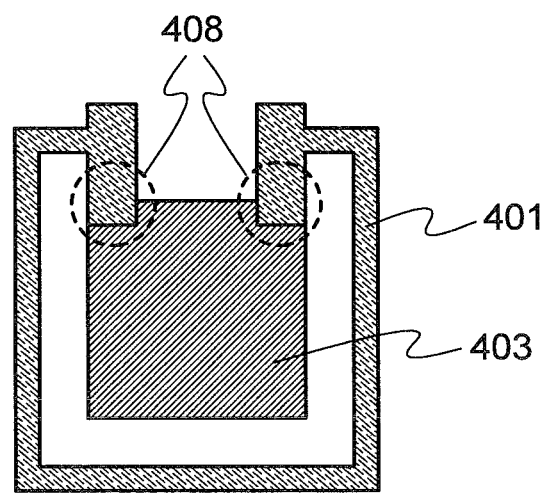
FIGS. 15A and 15B are diagrams illustrating a semiconductor device.

FIG. 15A is an enlarged view of the antenna and the semiconductor integrated circuit that are included in the semiconductor integrated circuit chip 400 illustrated in FIG. 14A. In FIG. 15A, an antenna 401 is a rectangular loop antenna whose number of turns is one; however, the embodiment of the disclosed invention is not limited to this structure. The shape of the loop antenna is not limited to a rectangular shape, but may be a shape with a curved line, for example, a circular shape. Furthermore, the number of turns is not limited to one but may be more than one. Note that, if the number of turns of the antenna 401 is one, the parasitic capacitance between the semiconductor integrated circuit 403 and the antenna 401 can be decreased.

Figure 15B:
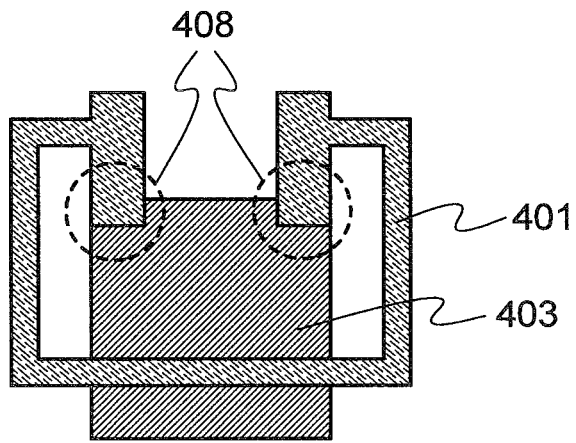

In FIGS. 14A and 15A, the antenna 401 is placed to surround the semiconductor integrated circuit 403, and the antenna 401 and the semiconductor integrated circuit 403 are placed in different regions except in portions corresponding to power feeding points 408 denoted by dashed lines. However, the embodiment of the disclosed invention is not limited to this structure. As illustrated in FIG. 15B, the antenna 401 may be placed to at least partially overlap the semiconductor integrated circuit 403 in portions other than the portions corresponding to the power feeding points 408 denoted by dashed lines. Note that, when the antenna 401 and the semiconductor integrated circuit 403 are placed in different regions as illustrated in FIGS. 14A and 15A, the parasitic capacitance between the semiconductor integrated circuit 403 and the antenna 401 can be decreased.

In FIG. 14A, the antenna 405 is electromagnetically coupled to the antenna 401 (electromagnetic induction) mainly in a loop portion surrounded by a dashed line 407, thereby transmitting and receiving signals and power. The antenna 405 can also transmit and receive signals and power to and from an interrogator in a region other than the portion surrounded by the dashed line 407. A radio wave used as a carrier (a carrier wave) between the interrogator and the semiconductor device preferably has a frequency of about 30 MHz to 5 GHz, and for example, may have a frequency band of 950 MHz or 2.45 GHz.

Although the antenna 405 has a rectangular loop shape whose number of turns is one in the portion surrounded by the dashed line 407, the embodiment of the disclosed invention is not limited to this structure. The loop portion is not limited to a rectangular shape, but may be a shape with a curved line, for example a circular shape. In addition, the number of turns is not limited to one but may be more than one.

The semiconductor device that is one embodiment of the disclosed invention may adopt an electromagnetic induction method, an electromagnetic coupling method, or a microwave method.

If a microwave method (e.g., UHF band (860 MHz band to 960 MHz band), or 2.45 GHz band) is used as the signal transmission method in the semiconductor device, the length, shape, or the like of the antenna may be determined as appropriate in consideration of the wavelength of an electromagnetic wave used for signal transmission. For example, the antenna may be formed into a linear shape (e.g., a dipole antenna), a flat shape (e.g., a patch antenna), or a ribbon shape. The shape of the antenna is not limited to a linear line, and it may be a curved line or a combination of a linear line and a curved line in consideration of the wavelength of an electromagnetic wave.

Figure 16:
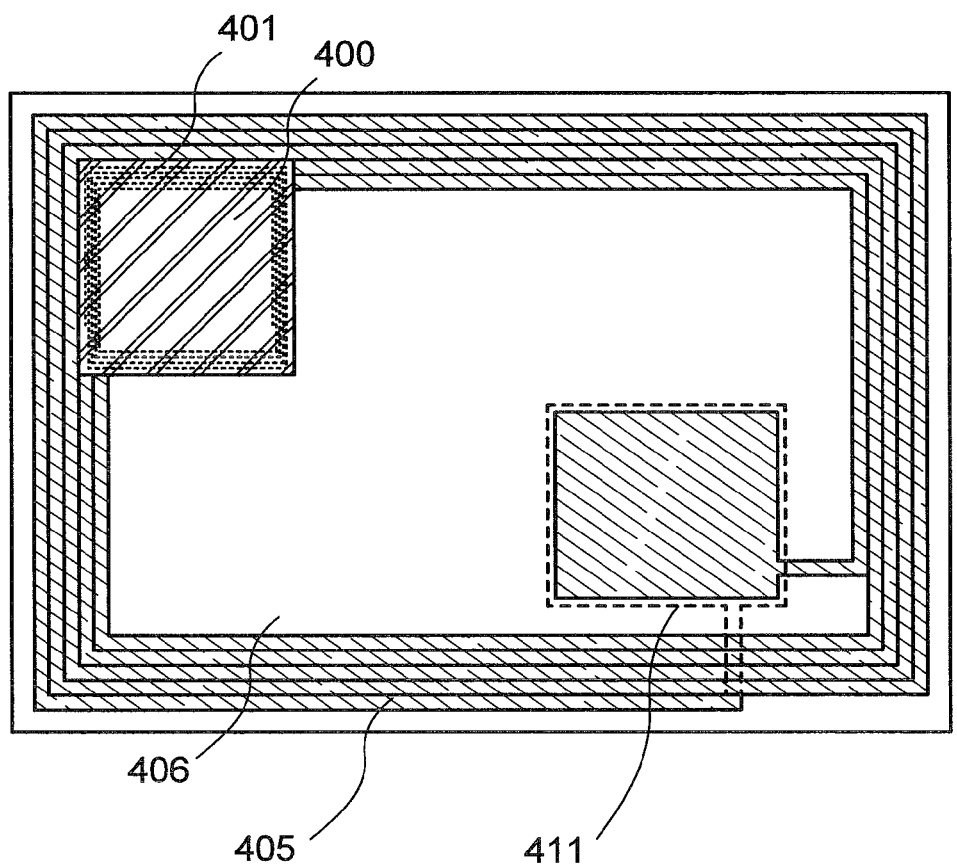
FIG. 16 is a diagram illustrating a semiconductor device.

FIG. 16 illustrates an example in which the antenna 401 and the antenna 405 each have a coil shape and adopt an electromagnetic induction method or an electromagnetic coupling method.

In FIG. 16, the coil antenna 405 is provided as a booster antenna over the supporting substrate 406, and the semiconductor integrated circuit chip 400 including the coil antenna 401 is provided over the supporting substrate 406. Note that the antenna 405, which is a booster antenna, forms a capacitor 411 with the supporting substrate 406 interposed therebetween.

Figure 14B:
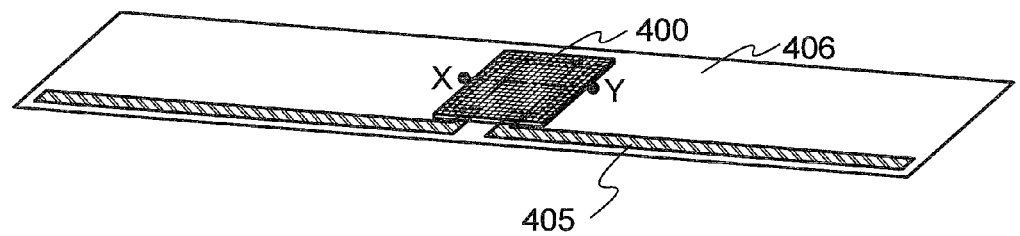
Figure 14C:
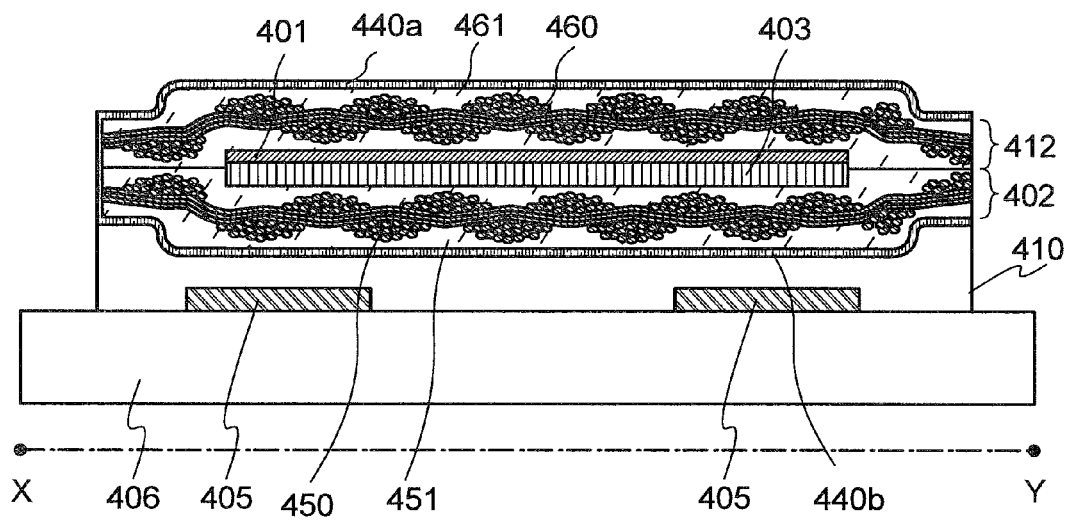

Next, the structures and arrangements of the semiconductor integrated circuit chip 400 and the booster antenna will be described. FIG. 14B is a perspective view of the semiconductor device illustrated in FIG. 14A, in which the semiconductor integrated circuit chip 400 and the antenna 405 formed over the supporting substrate 406 are stacked. FIG. 14C is a cross-sectional view taken along dashed line X-Y of FIG. 14B.

As the semiconductor integrated circuit chip 400 illustrated in FIG. 14C, the semiconductor device shown in Embodiment 1 or 2 can be used. Note that the semiconductor integrated circuit chip refers to a chip obtained by dividing the semiconductor devices into separate chips. The semiconductor integrated circuit chip 400 may include, for example, a structure body in which a fibrous body 450 is impregnated with an organic resin 451 and a structure body in which a fibrous body 460 is impregnated with an organic resin 461.

The semiconductor integrated circuit 403 illustrated in FIG. 14C is held between a first insulator 412 and a second insulator 402, and the side surfaces thereof are also sealed. In this embodiment, the semiconductor integrated circuit chip 400 is manufactured in the following manner: the first insulator and the second insulator are bonded to each other to hold a plurality of semiconductor integrated circuits therebetween, and then the semiconductor integrated circuits are divided into separate semiconductor integrated circuits. As a dividing means, laser light is preferably used.

The semiconductor device, which is one embodiment of the disclosed invention, includes the antenna 401, the semiconductor integrated circuit 403 electrically connected to the antenna 401, and a conductive layer 440a and a conductive layer 440b on the outer sides of the insulator 412 and 402 holding the semiconductor integrated circuit 403 (on the opposite side to the semiconductor integrated circuit 403). The conductive layers 440a and 440b transmit electromagnetic waves that are to be transmitted and received by the antenna included in the semiconductor device, and prevent static electricity from being externally applied to the semiconductor integrated circuit in the semiconductor device.

In FIG. 14C, the semiconductor integrated circuit 403 is placed nearer the antenna 405 than the antenna 401; however, the embodiment of the disclosed invention is not limited to this structure. The antenna 401 may be placed nearer the antenna 405 than the semiconductor integrated circuit 403. Furthermore, the semiconductor integrated circuit 403 and the antenna 401 may be directly attached to the first insulator 412 and the second insulator 402, or attached thereto with an adhesive layer.

In FIG. 14C, the semiconductor integrated circuit chip 400 is provided over the insulating layer 410 formed over the supporting substrate 406 and the antenna 405; however, the embodiment of the disclosed invention is not limited to this structure. For example, if the resistance of the conductive layer is sufficiently high, the conductive layer may be provided in contact with the antenna 405.

Figure 17:
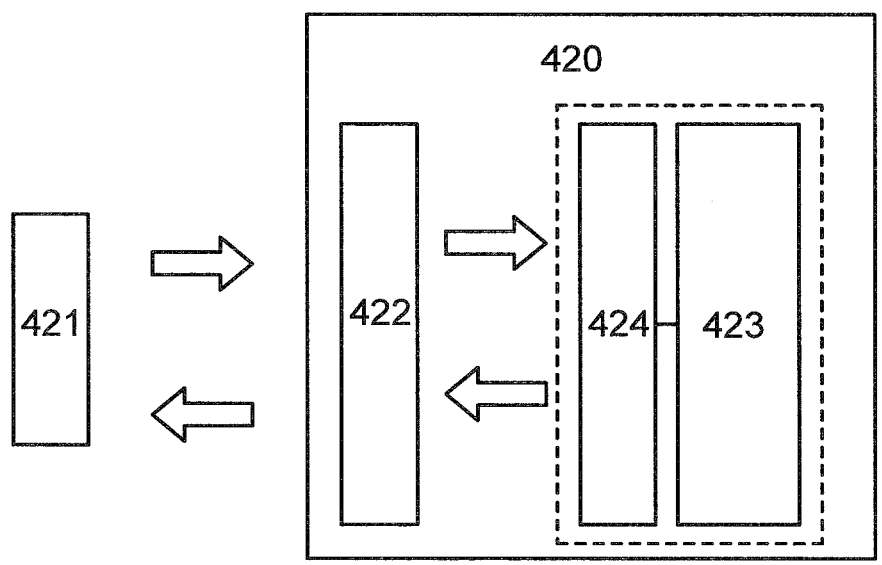
FIG. 17 is a diagram illustrating a semiconductor device.

Next, operation of the semiconductor device of this embodiment will be described. FIG. 17 is an example of a block diagram illustrating the configuration of the semiconductor device of this embodiment. A semiconductor device 420 illustrated in FIG. 17 includes an antenna 422 as a booster antenna, a semiconductor integrated circuit 423, and an antenna 424 as an on-chip antenna. When an electromagnetic wave is transmitted from an interrogator 421, the antenna 422 receives the electromagnetic wave to generate alternate current, whereby a magnetic field is generated around the antenna 422. Then, a loop portion of the antenna 422 is electromagnetically coupled to the loop antenna 424, so that induced electromotive force is generated in the antenna 424. The semiconductor integrated circuit 423 receives a signal or power from the interrogator 421 using the electromagnetic coupling. On the other hand, a signal can be transmitted to the interrogator 421 by flowing current through the antenna 424 in accordance with a signal generated in the semiconductor integrated circuit 423 to generate induced electromotive force in the antenna 422.

Note that the antenna 422 can be divided between the loop portion that is mainly electromagnetically coupled to the antenna 424 and a portion that mainly receives electromagnetic waves from the interrogator 421. The shape of the portion of the antenna 422, which mainly receives radio waves from the interrogator 421, is not particularly limited as long as the antenna 422 can receive radio waves. For example, the shape of a dipole antenna, a folded dipole antenna, a slot antenna, a meander line antenna, a microstrip antenna, or the like may be used.

Although FIGS. 14A to 14C illustrate the structure of the semiconductor integrated circuit having only one antenna, the embodiment of the disclosed invention is not limited to this structure. The semiconductor integrated circuit may have two antennas: one for receiving power and the other for receiving signals. When two antennas are included, both the frequency of radio waves for supplying power and the frequency of radio waves for transmitting radio waves can be used.

In the semiconductor device of this embodiment, the on-chip antenna is used and signals or power can be wirelessly transmitted and received to and from the booster antenna and the on-chip antenna. Therefore, unlike the case where an external antenna is connected to the semiconductor integrated circuit, disconnection between the semiconductor integrated circuit and the antenna by external stress is not likely to occur, which prevents initial defects in the connection. In addition, the booster antenna is used in this embodiment. Accordingly, unlike the case where only the on-chip antenna is used, the advantage of an external antenna can also be offered: that is, the area of the semiconductor integrated circuit does not significantly limit the size or shape of the on-chip antenna, the frequency band of radio waves capable of being received is not limited, and the communication distance can be increased.

In the semiconductor device that is one embodiment of the disclosed invention, the conductive layers provided on the surfaces of the circuit prevent electrostatic breakdown of the semiconductor integrated circuit (malfunction of the circuit, damage to the semiconductor elements, and the like) due to electrostatic discharge. As a result, a semiconductor device in which deterioration in characteristics due to electrostatic discharge is reduced can be manufactured at high yield. Since the semiconductor device of this embodiment has high reliability against external force and static electricity, it can be used under a wider variety of conditions and the application range of the semiconductor device can be increased.

Note that this embodiment can be implemented in appropriate combination with the structures or manufacturing methods shown in the other embodiments of this specification.

[Embodiment 6]

In this embodiment, an example of the application of the semiconductor devices capable of wirelessly transmitting and receiving data, which are manufactured by the aforementioned method, will be described below with reference to FIGS. 18A to 18C. The semiconductor device capable of wirelessly transmitting and receiving data is also called an RFID tag, an ID tag, an IC tag, an IC chip, an RF tag, a wireless tag, an electronic tag, or a wireless chip depending on the application.

Figure 18A:
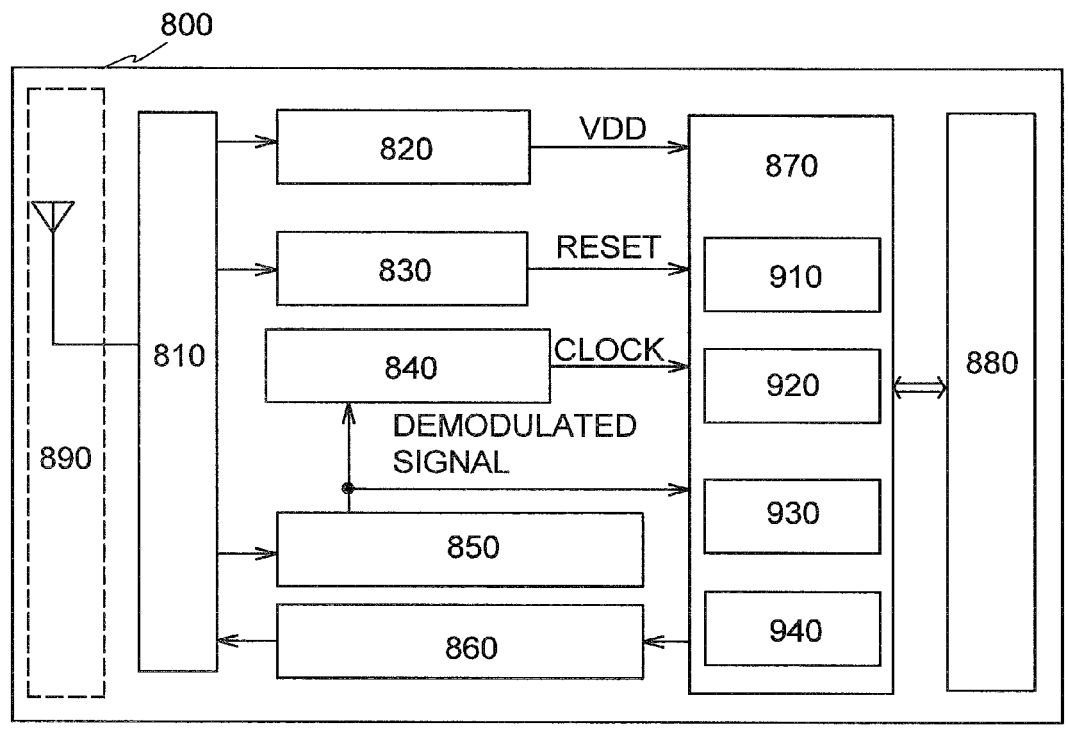
FIG. 18A is a diagram illustrating a semiconductor device and FIGS. 18B and 18C are views illustrating examples of the application of the semiconductor device.
Figure 18B:
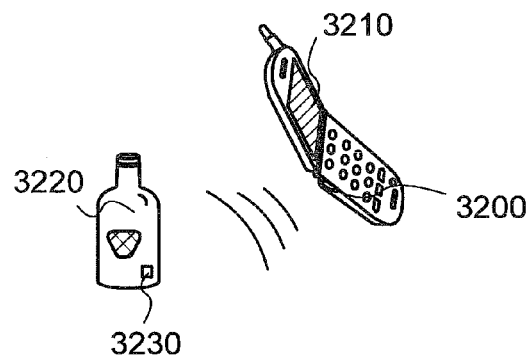
Figure 18C:
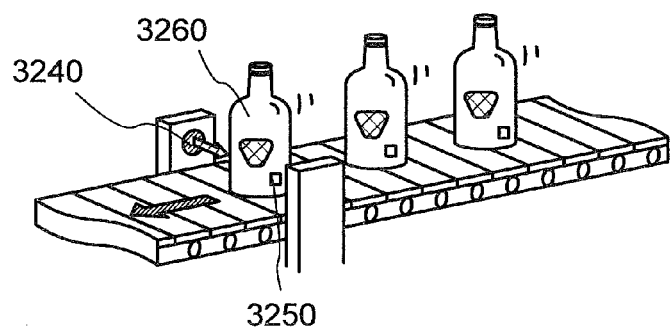
Figure 19A:
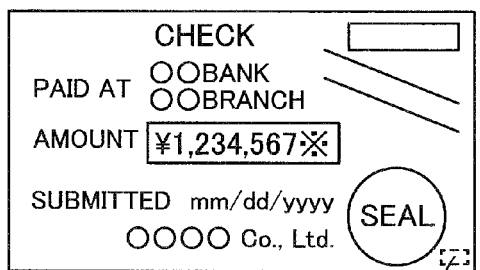
FIGS. 19A to 19G are views illustrating examples of the applications of a semiconductor device.
Figure 19B:
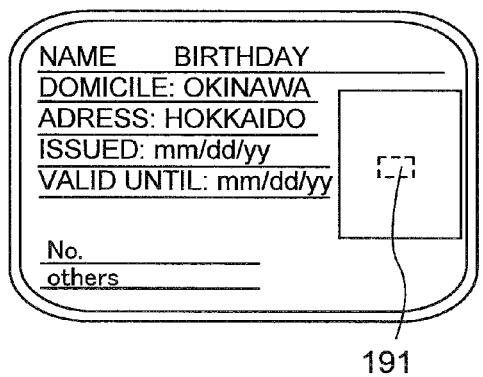
Figure 19C:
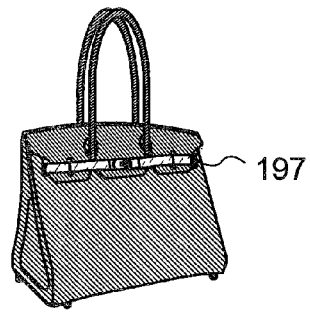
Figure 19D:
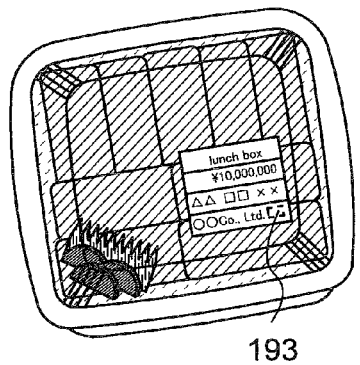
Figure 19E:
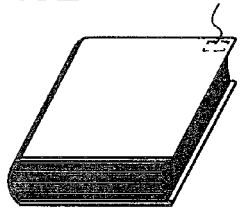
Figure 19F:
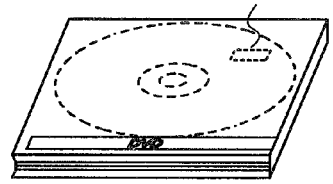
Figure 19G:
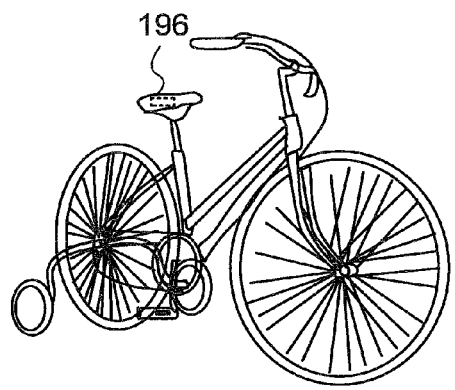

A semiconductor device 800 has a function of wirelessly transmitting and receiving data, and includes a high-frequency circuit 810, a power supply circuit 820, a reset circuit 830, a clock generation circuit 840, a data demodulation circuit 850, a data modulation circuit 860, a control circuit 870 for controlling other circuits, a memory circuit 880, and an antenna 890 (see FIG. 18A). The high-frequency circuit 810 receives a signal from the antenna 890 and outputs a signal received from the data demodulation circuit 860 through the antenna 890. The power supply circuit 820 generates a power supply potential from the received signal. The reset circuit 830 generates a reset signal. The clock generation circuit 840 generates various clock signals based on the signal input from the antenna 890. The data demodulation circuit 850 demodulates the received signal and outputs the signal to the control circuit 870. The data modulation circuit 860 modulates a signal received from the control circuit 870. The control circuit 870 includes, for example, a code extracting circuit 910, a code determining circuit 920, a CRC determining circuit 930, and an output unit circuit 940. The code extracting circuit 910 extracts a plurality of codes included in an instruction transmitted to the control circuit 870. The code determining circuit 920 compares the extracted code with a reference code to determine the content of the instruction. The CRC determining circuit 930 detects a transmission error and the like based on the determined code.

Next, an example of operation of the aforementioned semiconductor device 800 is described. First, a radio signal is received by the antenna 890. The radio signal is transmitted to the power supply circuit 820 via the high frequency circuit 810, thereby generating a high power supply potential (hereinafter referred to as a VDD). The VDD is supplied to each circuit of the semiconductor device 800. A signal transmitted to the data demodulation circuit 850 via the high frequency circuit 810 is demodulated (hereinafter referred to as a demodulated signal). Further, a signal and a demodulated signal passing through the reset circuit 830 and the clock generation circuit 840 via the high frequency circuit 810 are transmitted to the control circuit 870. The signals transmitted to the control circuit 870 are decoded by the code extracting circuit 910, the code determining circuit 920, the CRC determining circuit 930, and the like. Then, the data of the semiconductor device 800 stored in the memory circuit 880 is output based on the decoded signals. The output data of the semiconductor device 800 is encoded via the output unit circuit 940. In addition, the encoded data of the semiconductor device 800 passes through the data modulation circuit 860 to be transmitted as a radio signal via the antenna 890. Note that a low power supply potential (hereinafter referred to as a VSS) is common among a plurality of circuits included in the semiconductor device 800, and the VSS can be set to GND.

In this manner, the data of the semiconductor device 800 can be read by transmitting a signal from a communication device to the semiconductor device 800 and receiving a signal from the semiconductor device 800 by the communication device.

The semiconductor device 800 may have a structure in which no power supply (battery) is built-in but electromagnetic waves are used to supply a power supply voltage to each circuit, or a structure in which a power supply (a battery) is built-in and both electromagnetic waves and the power supply (the battery) are used to supply a power supply voltage to each circuit.

Next, an example of the application of a semiconductor device capable of wirelessly transmitting and receiving data is described. A communication device 3200 is provided on the side of a portable terminal including a display portion 3210, and a semiconductor device 3230 is provided on the side of a product 3220 (FIG. 18B). When the communication device 3200 is put close to the semiconductor device 3230 on the product 3220, information on the product 3220, such as the raw material or the source of the product, inspection result in each production step, history of the distribution process, and explanation of the product is displayed on the display portion 3210. When a product 3260 is transferred by a conveyer belt, the product 3260 can be inspected using a communication device 3240 and a semiconductor device 3250 provided on the product 3260 (FIG. 18C). The use of the semiconductor device for such a system allows information to be easily obtained, thereby achieving a system with high function and high added-value.

As described above, the application range of the highly reliable semiconductor device that is one embodiment of the disclosed invention is so wide that the semiconductor device can be used in a variety of fields.

Note that this embodiment can be implemented in appropriate combination with the structures or manufacturing methods shown in the other embodiments of this specification.

[Embodiment 7]

According to one embodiment of the disclosed invention, a semiconductor device can be formed which functions as a chip having a processor circuit (hereinafter, also referred to as a processor chip, a wireless chip, a wireless processor, a wireless memory, or a wireless tag). Such a semiconductor device can be applied to any product in order that the information on the product such as the history is wirelessly revealed and utilized in production, management, and the like. For example, the semiconductor device can be incorporated in bills, coins, securities, certificates, bearer bonds, packaging containers, books, recording media, personal belongings, vehicles, groceries, garments, health products, household goods, medicines, and electronic devices. Examples of such products will be described with reference to FIGS. 19A to 19G.

Bills and coins are money that circulates in the market, and includes one that can be used in the same way as money in a specific area (cash voucher), a commemorative coin, and the like. The securities refer to checks, certificates, promissory notes, and the like, and can be provided with a chip 190 including a processor circuit (see FIG. 19A). The certificates refer to driver's licenses, certificates of residence, and the like, and can be provided with a chip 191 including a processor circuit (see FIG. 19B). The personal belongings refer to bags, a pair of glasses, and the like, and can be provided with a chip 197 including a processor circuit (see FIG. 19C). Bearer bonds refer to stamps, rice coupons, various merchandise coupons, and the like. The packaging containers refer to wrapping paper for a lunch box or the like, plastic bottles, and the like and can be provided with a chip 193 including a processor circuit (see FIG. 19D). The books refer to hardbacks, paperbacks, and the like, and can be provided with a chip 194 including a processor circuit (see FIG. 19E). The recording media refer to DVD software, video tapes, and the like, and can be provided with a chip 195 including a processor circuit (see FIG. 19F). The vehicles refer to wheeled vehicles such as bicycles, ships, and the like, and can be provided with a chip 196 including a processor circuit (see FIG. 19G). The groceries refer to foods, beverages, and the like. The garments refer to clothes, shoes, and the like. The health products refer to medical apparatuses, health appliances, and the like. The household goods refer to furniture, lighting apparatuses, and the like. The medicines refer to drugs, agricultural chemicals, and the like. The electronic devices refer to liquid crystal display devices, EL display devices, television sets (a television receiver and a thin television receiver), cellular phones, and the like.

Such a semiconductor device can be provided by being attached to the surface of a product or being embedded in a product. For example, in the case of a book, the semiconductor device may be embedded in the paper; and in the case of a package made of an organic resin, the semiconductor device may be embedded in the organic resin.

By thus providing a semiconductor device in the packaging containers, the recording media, the personal belongings, the groceries, the garments, the household goods, the electronic devices, and the like, the efficiency of an inspection system, a system used in a rental shop, or the like can be improved. In addition, by providing a semiconductor device in the vehicles, forgery or theft can be prevented. Moreover, when a semiconductor device is implanted into creatures such as animals, each creature can be identified easily. For example, by implanting or attaching a semiconductor device with a sensor in or to a creature such as livestock, its health condition such as a current body temperature as well as its year of birth, sex, breed, or the like can be easily managed.

Note that this embodiment can be implemented in appropriate combination with the structures or manufacturing methods shown in the other embodiments of this specification.

[Embodiment 8]

In this embodiment, an example of mounting the semiconductor device of the present invention will be described with reference to FIGS. 20A to 20D.

The semiconductor device of the present invention can be mounted in a variety of products. This embodiment shows an example of manufacturing a flexible semiconductor device by mounting a semiconductor device on a flexible substrate.

Figure 20A:
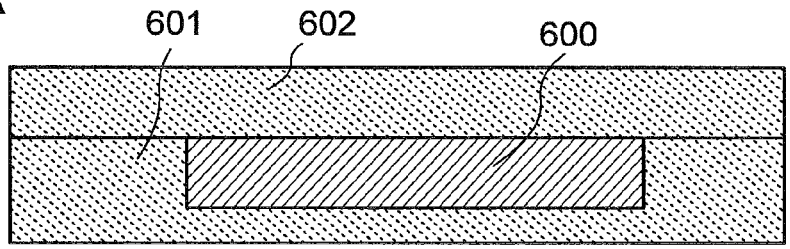
FIGS. 20A to 20D are diagrams illustrating a semiconductor device.
Figure 20B:
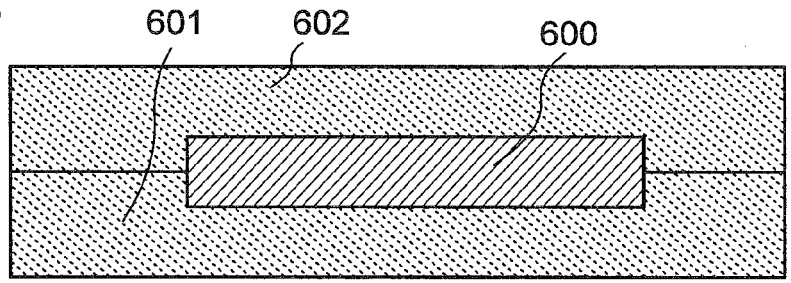
Figure 20C:
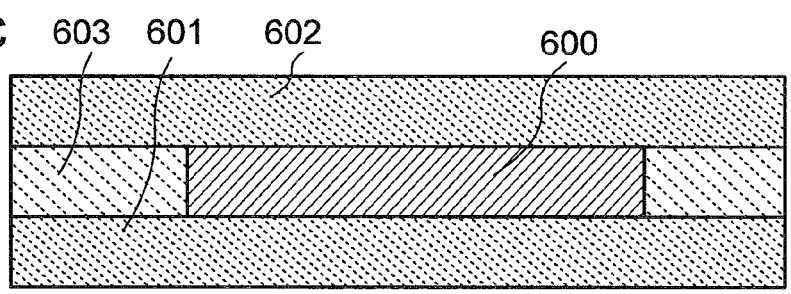
Figure 20D:
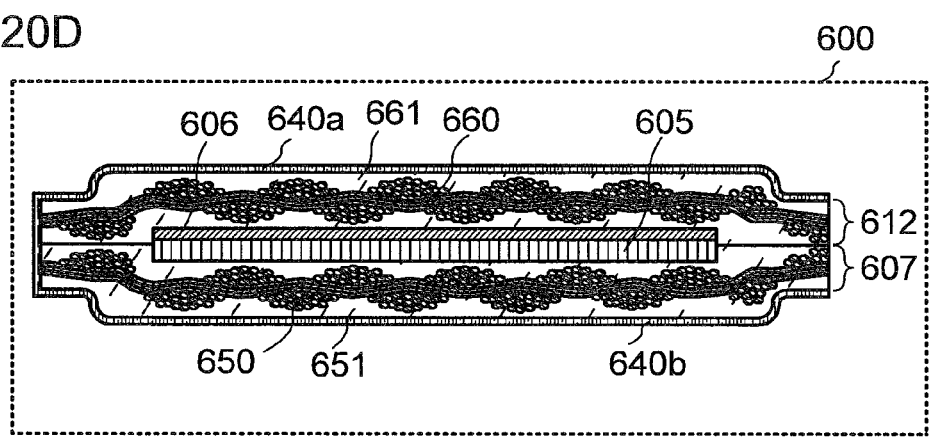

FIGS. 20A to 20C illustrate an example in which a semiconductor integrated circuit chip is embedded in a flexible substrate. As the semiconductor integrated circuit chip, the semiconductor device shown in Embodiment 1 or 2 can be used. Here, the semiconductor integrated circuit chip refers to a chip obtained by dividing the semiconductor devices into separate chips. FIG. 20D illustrates a semiconductor integrated circuit chip 600 in detail. The semiconductor integrated circuit chip 600 may include, for example, a structure body in which a fibrous body 650 is impregnated with an organic resin 661 and a structure body in which a fibrous body 660 is impregnated with an organic resin 661.

In FIG. 20D, an antenna 606 and a semiconductor integrated circuit 605 are held between a first insulator 612 and a second insulator 607, and the side surfaces thereof are also sealed. In this embodiment, the semiconductor integrated circuit is held between the first insulator 612 and the second insulator 607, and a conductive layer 640a and a conductive layer 640b are formed on the outer sides of the first insulator 612 and the second insulator 607, respectively. As a means to divide the semiconductor integrated circuit chips into separate chips, laser light is preferably used.

The conductive layers formed on the surfaces of the semiconductor integrated circuit prevent electrostatic breakdown of the semiconductor integrated circuit (malfunction of the circuit, damage to the semiconductor elements, and the like) due to electrostatic discharge. Furthermore, the pair of insulators holding the semiconductor integrated circuit provide a resistant semiconductor device having a reduced thickness and size and having high reliability. Also in the manufacturing process, it is possible to prevent shape defects and deterioration in characteristics of the semiconductor device due to external force and static electricity, and thus the semiconductor device can be manufactured at high yield.

FIG. 20A illustrates the semiconductor integrated circuit chip 600 that is held between a flexible substrate 601 and a flexible substrate 602. The semiconductor integrated circuit chip 600 is placed in a depressed portion formed in the flexible substrate 601.

The depressed portion in which the semiconductor integrated circuit chip 600 is placed may be formed in one or both of the flexible substrates. FIG. 20B illustrates an example in which the semiconductor integrated circuit chip 600 is placed in both depressed portions formed in the flexible substrate 601 and the flexible substrate 602.

Further, three flexible substrates may be stacked and the semiconductor integrated circuit chip 600 may be placed in an opening formed in the middle flexible substrate. FIG. 20C illustrates an example in which an opening is formed in a flexible substrate 603, the semiconductor integrated circuit chip 600 is placed in the opening, and the flexible substrate 603 and the semiconductor integrated circuit chip 600 are held between the flexible substrate 601 and the flexible substrate 602.

In FIGS. 20A to 20C, flexible substrates may be further stacked on the outer sides of the flexible substrates 601 and 602.

For the flexible substrates 601, 602, and 603, it is possible to use a film substrate, a woven fabric that is woven from bundles of fibers (single yarns) (hereinafter referred to as yarn bundles) used for warp yarns and weft yarns, a nonwoven fabric obtained by stacking yarn bundles of plural kinds of fibers randomly or regularly, paper, or the like. Specifically, the following can be used: a substrate made of polyethylene terephthalate (PET), polyethylene naphthalate (PEN), polyethersulfone (PES), polypropylene, polypropylene sulfide, polycarbonate, polyetherimide, polyphenylene sulfide, polyphenylene oxide, polysulfone, polyphthalamide, or the like; a substrate made of polypropylene, polyester, vinyl, polyvinyl fluoride, vinyl chloride, polyamide, or the like; a film; a prepreg; paper made of a fibrous material; and the like. A film stack including an adhesive synthetic resin film (such as an acrylic synthetic resin or an epoxy synthetic resin), or the like may be used. When a substrate or a film is bonded to a subject to be processed, a bonding layer may be used. The bonding can be performed by thermal treatment or application of pressure under the conditions selected in accordance with the kind of the substrate or the film. The bonding layer corresponds to a layer containing an adhesive such as a thermosetting resin, a UV curing resin, an epoxy resin adhesive, or a resin additive As described in this embodiment, when the semiconductor integrated circuit chip 600 is embedded in a depressed portion or an opening formed in a flexible substrate on which the semiconductor integrated circuit chip 600 is mounted, a projected portion is not formed due to the provision of the semiconductor integrated circuit chip 600; therefore, the flexible substrate can have a flat surface and a uniform thickness. Accordingly, even if pressure is applied with a roller or the like for mounting the semiconductor integrated circuit chip on the flexible substrate, pressure can be prevented from being locally applied (concentrated) on the semiconductor integrated circuit chip. Thus, damage to the semiconductor integrated circuit chip can be reduced in a mounting process, resulting in a higher yield of semiconductor devices. In addition, the semiconductor device on which the semiconductor integrated circuit chip is mounted is also resistant to external stress and can have high reliability.

Furthermore, since the semiconductor integrated circuit chip can have a flat and smooth surface, it can be easily stored and transferred. In addition, the semiconductor integrated circuit chip is not visually recognized from the outside (because a projected portion reflecting the shape of the semiconductor integrated circuit chip does not appear on the surface of the semiconductor device); thus, the security of the semiconductor device can be improved.

Note that this embodiment can be implemented in appropriate combination with the structures or manufacturing methods shown in the other embodiments of this specification.

EXAMPLE 1

This example shows the results of verification of the manufacturing method that is one embodiment of the disclosed invention.

A sample was manufactured in the following manner: a first conductive layer, a third insulator, a first insulator, an antenna, a semiconductor integrated circuit, a second insulator, a fourth insulator, and a second conductive layer were stacked, and the layered structure was divided into separate semiconductor devices by laser light irradiation. As a comparative example, another sample was prepared in the following manner: a first conductive layer, a third insulator, a first insulator, an antenna, a semiconductor integrated circuit, a second insulator, a fourth insulator, and a second conductive layer were stacked, and the layered structure was divided with a knife into separate semiconductor devices.

In the above samples, a prepreg (with a thickness of 20 µm) that is a structure body in which a fibrous body (glass fiber) is impregnated with an organic resin (brominated epoxy resin) was used for the first insulator and the second insulator. As the first conductive layer and the second conductive layer, a titanium film (with a thickness of 10 nm) was formed by sputtering. An aramid film (with a thickness of 12 µm) was used for the third insulator and the fourth insulator. Note that a silicon nitride film was formed as a protective layer over the antenna, and an acrylic resin (with a thickness of 10 µm) was formed as an adhesive layer between the third insulator and the semiconductor integrated circuit.

Figure 21:
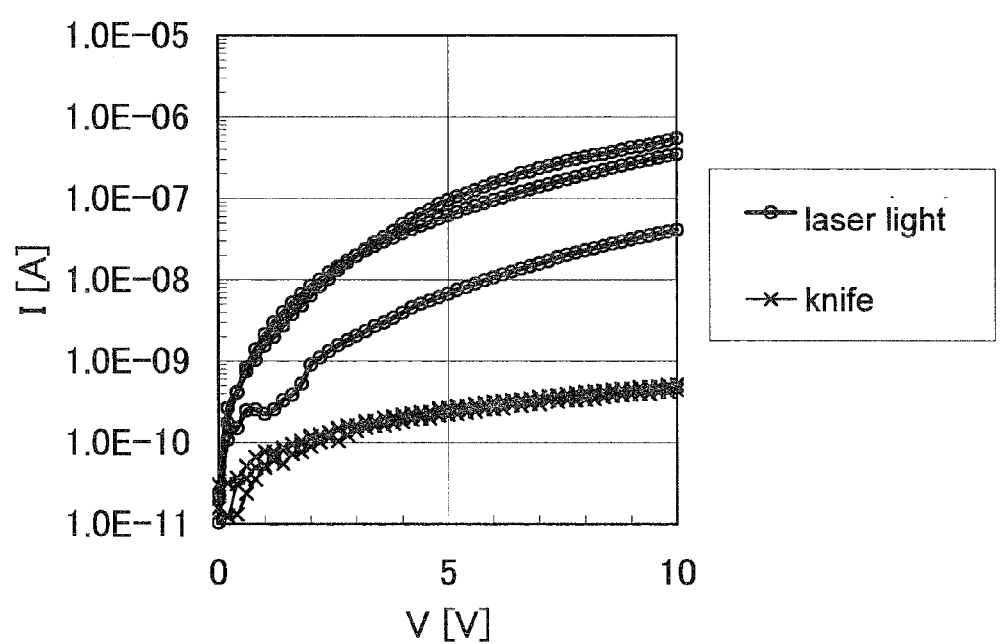
FIG. 21 is a graph showing the results of verification of the manufacturing method.

Voltage was applied to the above samples (three samples and three comparative samples), and then the value of current flowing between the first conductive layer and the second conductive layer was measured. FIG. 21 shows the relationship between applied voltage and current.

FIG. 21 shows that the current value is larger (the resistance value is smaller) in the samples divided by laser light irradiation than in the samples divided with a knife. Specifically, in the samples divided with a knife, the resistance value between the first conductive layer and the second conductive layer was about 20 GΩ (at 10 V). On the other hand, in the samples divided by laser light irradiation, the resistance value between the first conductive layer and the second conductive layer was about 10 MΩ to 200 MΩ (at 10 V).

Thus, it was found that the resistance between the first conductive layer and the second conductive layer was decreased when the semiconductor devices were divided by laser light irradiation. This is thought to be because, in the case of dividing the semiconductor devices by laser light irradiation, materials of the conductive layers are dispersed in the insulators when the insulators are melted, whereby the conductive layers are electrically connected to each other, whereas in the case of dividing the semiconductor devices with a knife, no current path is formed by the materials of the conductive layers. Note that static electricity can be sufficiently dissipated if the resistance between the first conductive layer and the second conductive layer is about 1 GΩ or less (at 10 V). Therefore, countermeasures against static electricity may be implemented in consideration of this resistance value.

Note that the structure shown in this example can be implemented in appropriate combination with the structures or manufacturing methods shown in the other embodiments of this specification.

EXAMPLE 2

This example shows the results of verification of the effect of conductive layers.

As a sample (an example), a rectangular layered structure was manufactured in which a first conductive layer, a fourth insulator, a first insulator, an antenna, a semiconductor integrated circuit, a third insulator, a second insulator, and a second conductive layer were stacked. As another sample (a comparative example), a rectangular layered structure was manufactured in which a fourth insulator, a first insulator, an antenna, a semiconductor integrated circuit, a third insulator, and a second insulator were stacked.

In the above samples, a prepreg (with a thickness of 20 µm) that is a structure body in which a fibrous body (glass fiber) is impregnated with an organic resin (brominated epoxy resin) was used for the first insulator and the second insulator. As the first conductive layer and the second conductive layer, a titanium film (with a thickness of 10 nm) was formed by sputtering. An aramid film (with a thickness of 12 µm) was used for the third insulator and the fourth insulator. Note that a silicon nitride film was formed as a protective layer over the antenna, and an acrylic resin (with a thickness of 10 µm) was formed as an adhesive layer between the third insulator and the semiconductor integrated circuit. In addition, the first conductive layer formed on the surface of the fourth insulator and the second conductive layer formed on the surface of the second insulator are electrically connected to each other on one side of the rectangle.

Five samples having the structure of the example and five samples having the structure of the comparative example were manufactured, and ESD measurement and a bending test were performed.

As the ESD measurement, a sample was put on a layered structure of a glass substrate (with a thickness of 0.5 nm), an aluminum plate, and a conductive sheet, and voltage was applied by an ESD tester (for simple response evaluation, manufactured by Takaya corporation) from the side of the sample on which the first conductive layer or the second conductive layer is formed to the center of the integrated circuit. Then, the static charges were eliminated (for one minute) and operation check was performed. Note that the operation check was performed assuming that a surface closer to the antenna than to the semiconductor integrated circuit is a front surface and a surface opposite to the antenna is a rear surface.

Table 1 shows the results of the ESD measurement of the examples and the comparative examples. Note that the ESD measurement was performed for five examples and five comparative examples. In the results of the ESD measurement, the denominator represents the number of samples tested, and the numerator represents the number of samples that operated.

TABLE 1

Results of the ESD measurement

| ESD applied voltage [kV] | ESD applied from antenna side | | ESD applied from semiconductor integrated circuit side | |
|---|---|---|---|---|
| | Comparative example | Example | Comparative example | Example |
| 5 kV | 1/5 | 5/5 | 0/5 | 5/5 |
| 10 kV | 0/5 | 5/5 | 0/5 | 5/5 |
| 15 kV | 0/5 | 5/5 | 0/5 | 5/5 |

In the comparative examples that do not include the conductive layer, four of the five samples did not operate when a voltage of 5 kV was applied from the front surface, and none of the samples operated when a voltage of 10 kV and a voltage of 15 kV were applied. When voltages of 5 kV, 10 kV, and 15 kV were applied from the rear surface, none of the samples operated. On the other hand, in the examples that include the conductive layers, all the five samples operated even when a voltage of 15 kV was applied from either the front surface or the rear surface.

Furthermore, a bending test was performed for five samples having the structure of the example and five samples having the structure of the comparative example.

The bending test was performed in the following manner: five samples having the structure of the example and five samples having the structure of the comparative example were placed on a polyethylene naphthalate tape having a 670 g weight on a side, and the polyethylene naphthalate tape was moved back and forth on a metal rod wrapped in a piece of paper.

Table 2 shows the results of the bending test for the examples and the comparative examples. The results indicate the judgment whether the samples operate normally after the bending test was performed 300 times. In the results, the denominator represents the number of samples tested, and the numerator represents the number of samples that operated.

TABLE 2

| | Comparative example | Example |
|---|---|---|
| Judgment | 0/5 | 5/5 |

In the comparative examples that do not include the conductive layer, none of the five samples operated after moving back and forth 300 times. On the other hand, in the examples that include the conductive layers, all the five samples were found to operate after moving back and forth 300 times. Thus, it was found that electrostatic breakdown due to electrostatic discharge could be prevented by covering the integrated circuit with the conductive layers.

Thus, it was found that the conductive layers formed to cover the semiconductor integrated circuit could prevent electrostatic breakdown of the semiconductor integrated circuit (malfunction of the circuit, damage to the semiconductor elements, and the like) due to electrostatic discharge, and a resistant semiconductor device having a reduced thickness and size and having high reliability could be provided.

Note that the structure shown in this example can be implemented in appropriate combination with the structures or manufacturing methods shown in the other embodiments of this specification.

This application is based on Japanese Patent Application serial No. 2008-149693 filed with Japan Patent Office on Jun. 6, 2008, the entire contents of which are hereby incorporated by reference.

EXPLANATION OF REFERENCE

100: substrate, 102: separation layer, 104: semiconductor integrated circuit, 106: antenna, 110: element layer, 112: insulator, 114: conductive layer, 140a: conductive layer, 140b: conductive layer, 116: insulator, 118: conductive layer, 160: fibrous body, 161: organic resin, 190: chip, 191: chip, 193: chip, 194: chip, 195: chip, 196: chip, 197: chip, 400: semiconductor integrated circuit chip, 401: antenna, 402: insulator, 403: semiconductor integrated circuit, 405: antenna, 406: supporting substrate, 407: dashed line, 408: feeding point, 410: insulating layer, 411: capacitor, 412: insulator, 420: semiconductor device, 421: interrogator, 422: antenna, 423: semiconductor integrated circuit, 424: antenna, 500: microprocessor, 501: arithmetic logic unit, 502: ALU controller, 503: instruction decoder, 504: interrupt controller, 505: timing controller, 506: register, 507: register controller, 508: bus interface, 509: read only memory, 510: memory interface, 511, RFCPU, 512: analog circuit portion, 513: digital circuit portion, 514: resonance circuit, 515: rectifier circuit, 516: constant voltage circuit, 517: reset circuit, 518: oscillator circuit, 519: demodulation circuit, 520: modulation circuit, 521: RF interface, 522: control register, 523: clock controller, 524: CPU interface, 525: central processing unit, 526: random access memory, 527: read only memory, 528: antenna, 529: capacitor portion, 530: power supply control circuit, 600: semiconductor integrated circuit chip, 601: flexible substrate, 602: flexible substrate, 603: flexible substrate, 605: semiconductor integrated circuit, 606: antenna, 607: insulator, 612: insulator, 640a: conductive layer, 640b: conductive layer, 701: substrate, 702: separation layer, 703: insulating film, 704: semiconductor film, 704a: semiconductor film, 704b: semiconductor film, 704c: semiconductor film, 704d: semiconductor film, 705: gate insulating film, 706a: channel formation region, 706b: impurity region, 706c: impurity region, 707: gate electrode, 708: insulating film, 709: insulating film, 710: insulating film, 711: insulating film, 712a: opening, 713: conductive film, 714: insulating film, 715: insulator, 715a: insulator, 715b: organic resin, 716: conductive layer, 717: insulator, 717a: fibrous body, 717b: organic resin, 718: conductive layer, 730a: thin film transistor, 730b: thin film transistor, 730c: thin film transistor, 730d: thin film transistor, 731: conductive film, 751: element layer, 800: semiconductor device, 810: high frequency circuit, 820: power supply circuit, 830: reset circuit, 840: clock generation circuit, 850: data demodulation circuit, 860: data modulation circuit, 870: control circuit, 880: memory circuit, 890: antenna, 910: code extracting circuit, 920: code determining circuit, 930: CRC determining circuit, 940: output unit circuit, 3200: communication device, 3210: display portion, 3220: product, 3230: semiconductor device, 3240: communication device, 3250: semiconductor device, and 3260: product.

The invention claimed is:

1. A method for manufacturing a semiconductor device comprising:
   sealing a plurality of element layers each containing a semiconductor integrated circuit and an antenna between a first insulator and a second insulator;
   forming a layered structure containing a first conductive layer, the first insulator, the plurality of element layers, the second insulator, and a second conductive layer, wherein the first insulator, the plurality of element layers, and the second insulator are interposed between the first conductive layer and the second conductive layer; and
   melting the first insulator and the second insulator after forming the first conductive layer and the second conductive layer, whereby the layered structure is divided so as to include at least one of the semiconductor integrated circuits and one of the antennas,
   wherein the first conductive layer and the second conductive layer are electrically connected to each other simultaneously with the step of melting the first insulator and the second insulator.

2. The method for manufacturing a semiconductor device according to claim 1, wherein a resistance between the first conductive layer and the second conductive layer is reduced to 1 GΩ or less by the dividing step.

3. The method for manufacturing a semiconductor device according to claim 1, wherein the first conductive layer or the second conductive layer has a multi-layer structure.

4. The method for manufacturing a semiconductor device according to claim 1, wherein at least one of the first insulator and the second insulator has a thickness of 5 μm to 50 μm.

5. The method for manufacturing a semiconductor device according to claim 1, wherein the first insulator or the second insulator has a structure body in which a fibrous body is impregnated with an organic resin.

6. The method for manufacturing a semiconductor device according to claim 1, wherein the semiconductor device further comprises a booster antenna electromagnetically coupled to the antenna.

7. A method for manufacturing a semiconductor device comprising:
   sealing a plurality of element layers each containing a semiconductor integrated circuit and an antenna between a first insulator and a second insulator;
   forming a layered structure containing a first conductive layer, the first insulator, the plurality of element layers, the second insulator, and a second conductive layer, wherein the first insulator, the plurality of element layers, and the second insulator are interposed between the first conductive layer and the second conductive layer; and
   irradiating the layered structure with laser light after forming the first conductive layer and the second conductive layer, whereby the layered structure is divided so as to include at least one of the semiconductor integrated circuits and one of the antennas,
   wherein the first conductive layer and the second conductive layer are electrically connected to each other simultaneously with the step of irradiating the layered structure with the laser light.

8. The method for manufacturing a semiconductor device according to claim 7, wherein a resistance between the first conductive layer and the second conductive layer is reduced to 1 GΩ or less by the dividing step.

9. The method for manufacturing a semiconductor device according to claim 7, wherein the first conductive layer or the second conductive layer has a multi-layer structure.

10. The method for manufacturing a semiconductor device according to claim 7, wherein at least one of the first insulator and the second insulator has a thickness of 5 μm to 50 μm.

11. The method for manufacturing a semiconductor device according to claim 7, wherein the first insulator or the second insulator has a structure body in which a fibrous body is impregnated with an organic resin.

12. The method for manufacturing a semiconductor device according to claim 7, wherein the semiconductor device further comprises a booster antenna electromagnetically coupled to the antenna.

13. A method for manufacturing a semiconductor device comprising:
   forming a plurality of element layers each containing a semiconductor integrated circuit and an antenna over a substrate;
   forming a first insulator over the plurality of element layers;
   forming a first conductive layer over the first insulator;
   separating the plurality of element layers from the substrate;
   forming a second insulator at an opposite side of the first insulator;
   forming a second conductive layer over the second insulator; and
   melting the first insulator and the second insulator after forming the first conductive layer and the second conductive layer, whereby the plurality of element layers are divided so as to include at least one of the semiconductor integrated circuits and one of the antennas,
   wherein the first conductive layer and the second conductive layer are electrically connected to each other simultaneously with the step of melting the first insulator and the second insulator.

14. The method for manufacturing a semiconductor device according to claim 13, wherein a resistance between the first conductive layer and the second conductive layer is reduced to 1 GΩ or less by the dividing step.

15. The method for manufacturing a semiconductor device according to claim 13, wherein the first conductive layer or the second conductive layer has a multi-layer structure.

16. The method for manufacturing a semiconductor device according to claim 13, wherein at least one of the first insulator and the second insulator has a thickness of 5 μm to 50 μm.

17. The method for manufacturing a semiconductor device according to claim 13, wherein the first insulator or the second insulator has a structure body in which a fibrous body is impregnated with an organic resin.

18. The method for manufacturing a semiconductor device according to claim 13, wherein the semiconductor device further comprises a booster antenna electromagnetically coupled to the antenna.

19. A method for manufacturing a semiconductor device comprising:
   forming a plurality of element layers each containing a semiconductor integrated circuit and an antenna over a substrate;
   forming a first insulator over the plurality of element layers;

forming a first conductive layer over the first insulator;

separating the plurality of element layers from the substrate;

forming a second insulator at an opposite side of the first insulator;

forming a second conductive layer over the second insulator; and irradiating the first insulator and the second insulator with laser light after forming the first conductive layer and the second conductive layer, whereby the plurality of element layers are divided so as to include at least one of the semiconductor integrated circuits and one of the antennas, wherein the first conductive layer and the second conductive layer are electrically connected to each other simultaneously with the step of irradiating the first insulator and the second insulator with the laser light.

20. The method for manufacturing a semiconductor device according to claim 19, wherein a resistance between the first conductive layer and the second conductive layer is reduced to 1 GΩ or less by the dividing step.

21. The method for manufacturing a semiconductor device according to claim 19, wherein the first conductive layer or the second conductive layer has a multi-layer structure.

22. The method for manufacturing a semiconductor device according to claim 19, wherein at least one of the first insulator and the second insulator has a thickness of 5 μm to 50 μm.

23. The method for manufacturing a semiconductor device according to claim 19, wherein the first insulator or the second insulator has a structure body in which a fibrous body is impregnated with an organic resin.

24. The method for manufacturing a semiconductor device according to claim 19, wherein the semiconductor device further comprises a booster antenna electromagnetically coupled to the antenna.

* * * * *